United States Patent
Song et al.

(10) Patent No.: US 10,171,091 B2
(45) Date of Patent: Jan. 1, 2019

(54) PHASE INTERPOLATOR FOR INTERPOLATING PHASE OF DELAY CLOCK SIGNAL AND DEVICE INCLUDING THE SAME AND FOR PERFORMING DATA SAMPLING BY USING PHASE INTERPOLATED CLOCK SIGNAL

(71) Applicant: Samsung Electronics Co., Ltd., Suwon-si, Gyeonggi-do (KR)

(72) Inventors: Kyung-seok Song, Busan (KR); Byoung-joo Yoo, Seoul (KR); Chang-kyung Seong, Yongin-si (KR)

(73) Assignee: SAMSUNG ELECTRONICS CO., LTD., Gyoenggi-Do (KR)

( * ) Notice: Subject to any disclaimer, the term of this patent is extended or adjusted under 35 U.S.C. 154(b) by 0 days.

(21) Appl. No.: 15/426,330

(22) Filed: Feb. 7, 2017

(65) Prior Publication Data

US 2018/0152190 A1    May 31, 2018

(30) Foreign Application Priority Data

Nov. 30, 2016  (KR) .................. 10-2016-0162295

(51) Int. Cl.
| | |
|---|---|
| H04L 7/04 | (2006.01) |
| H04L 7/033 | (2006.01) |
| H03L 7/081 | (2006.01) |
| H03L 7/08 | (2006.01) |
| H04L 7/00 | (2006.01) |

(Continued)

(52) U.S. Cl.
CPC .............. *H03L 7/0818* (2013.01); *H03L 7/07* (2013.01); *H03L 7/0807* (2013.01); *H03L 7/0814* (2013.01); *H04L 7/0025* (2013.01); *H04L 7/0037* (2013.01); *H04L 7/0087* (2013.01); *H04L 7/0331* (2013.01); *H03K 5/131* (2013.01)

(58) Field of Classification Search
USPC ...... 375/215, 223, 224–228, 240.26, 240.27, 375/240.28, 254, 259, 257, 285, 284, 278, 375/279, 271, 293, 294, 295, 316, 346, 375/354, 356, 359, 362, 363, 364, 373, 375/374, 375, 376, 371, 370
See application file for complete search history.

(56) References Cited

U.S. PATENT DOCUMENTS 6,661,272 B2  12/2003  Kim et al.
7,050,522 B2   5/2006  Schmatz
(Continued)

*Primary Examiner* — Linda Wong
(74) *Attorney, Agent, or Firm* — Harness, Dickey & Pierce, P.L.C.

(57) ABSTRACT

A phase interpolator includes a control circuit configured to generate a selection control signal that corresponds to a selected coarse phase interval, and generate a weight setting signal for generating a phase interpolation clock signal with an interpolated phase within the coarse phase interval; a phase selector configured to receive a plurality of inversion delay clock signal pairs, select at least two inversion delay clock signal pairs from the plurality of inversion delay clock signal pairs based on the selection control signal, select and output a selection delay clock signal pair corresponding to the coarse phase interval from the selected at least two inversion delay clock signal pairs; and a phase mixer configured to receive the selection delay clock signal pair from the phase selector and generate the phase interpolation clock signal based on the weight setting signal.

9 Claims, 21 Drawing Sheets

(51) Int. Cl.
*H03L 7/07* (2006.01)
*H03K 5/131* (2014.01)

(56) References Cited

U.S. PATENT DOCUMENTS

| | | |
|---|---|---|
| 7,095,816 B2 | 8/2006 | Kishine et al. |
| 7,593,496 B2 | 9/2009 | Fan et al. |
| 7,746,971 B2 | 6/2010 | Masui et al. |
| 8,081,024 B1 | 12/2011 | Evans |
| 8,242,850 B2 | 8/2012 | Tsangaropoulos et al. |
| 8,559,587 B1 | 10/2013 | Buell et al. |
| 8,872,686 B2 | 10/2014 | Chou et al. |
| 9,166,770 B2 * | 10/2015 | Asada ................. H03L 7/08 |
| 9,236,873 B1 | 1/2016 | Buell |
| 9,281,805 B2 | 3/2016 | Tomita et al. |
| 9,337,874 B1 | 5/2016 | Yu et al. |
| 2007/0103212 A1 * | 5/2007 | Lee ................. H03K 5/1565 |
| | | 327/149 |
| 2010/0039157 A1 * | 2/2010 | Kaeriyama ............ G06F 1/08 |
| | | 327/292 |
| 2012/0182059 A1 * | 7/2012 | Kwak ................. G11C 7/1072 |
| | | 327/299 |
| 2015/0263850 A1 * | 9/2015 | Asada ................. H03L 7/08 |
| | | 375/371 |
| 2016/0105165 A1 * | 4/2016 | Shim ................. H03K 5/1565 |
| | | 327/175 |
| 2016/0156342 A1 * | 6/2016 | Yun ................. H03K 7/08 |
| | | 327/158 |

* cited by examiner

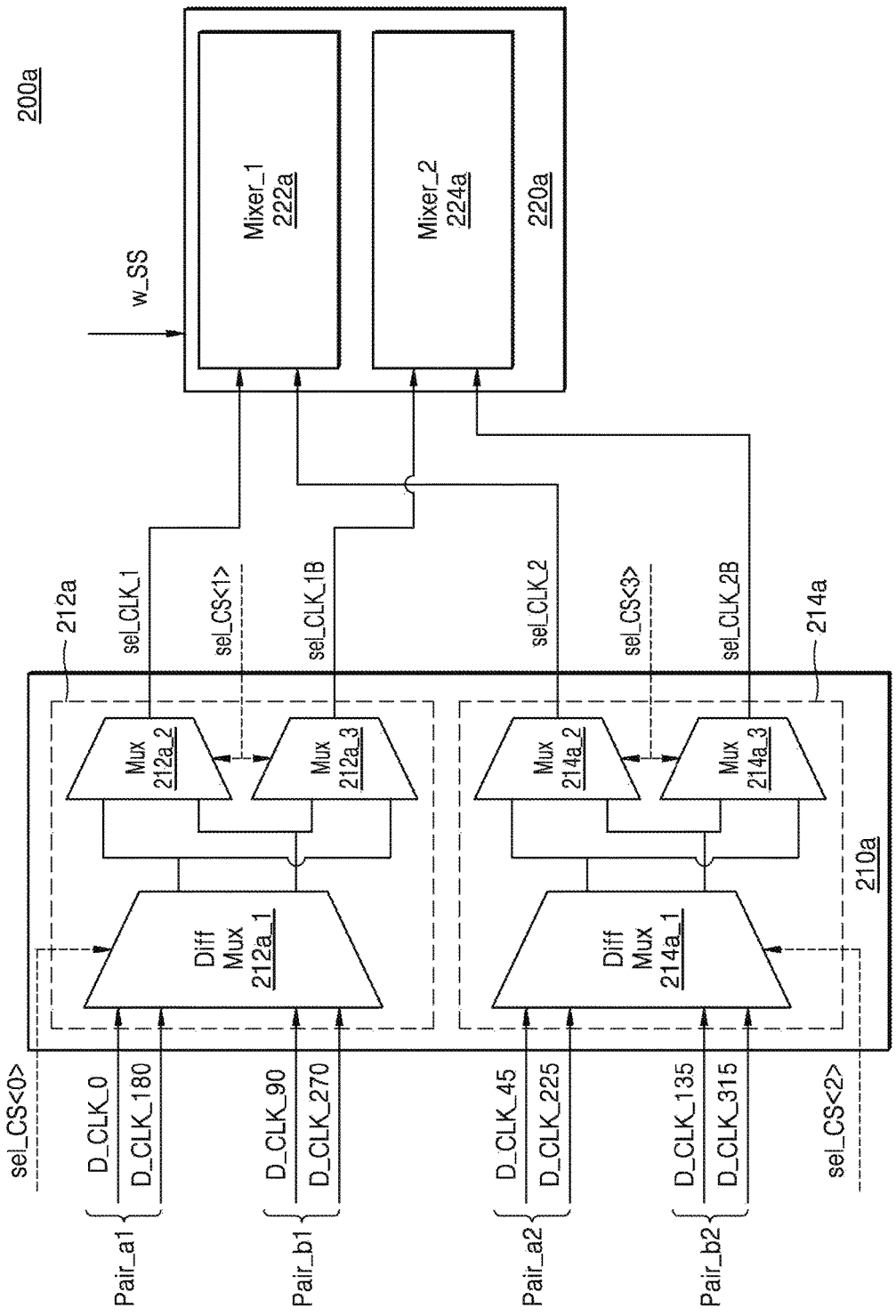

FIG. 4B

Table_1

| sel_CS<3:0> | sel_CLK_1 | sel_CLK_2 |
|---|---|---|
| 4'b0000 | D_CLK_0 | D_CLK_45 |
| 4'b0001 | D_CLK_90 | D_CLK_45 |
| 4'b0101 | D_CLK_90 | D_CLK_135 |
| 4'b0110 | D_CLK_180 | D_CLK_135 |
| 4'b1010 | D_CLK_180 | D_CLK_225 |
| 4'b1011 | D_CLK_270 | D_CLK_225 |
| 4'b1111 | D_CLK_270 | D_CLK_315 |
| 4'b1100 | D_CLK_0 | D_CLK_315 |

FIG. 9

| PL_CLK_out (Phase) | sel_CS<3:0> (MSB) | w_SS<7:0> (LSB) | PL_CLK_out (Phase) | sel_CS<3:0> (MSB) | w_SS<7:0> (LSB) |
|---|---|---|---|---|---|
| 0 <br> . <br> . <br> . <br> . <br> . <br> . <br> 45 | 4'b0000 <br> (Interval_1) | 8'b00000000 <br> 8'b00000001 <br> 8'b00000011 <br> 8'b00000111 <br> 8'b00001111 <br> 8'b00011111 <br> 8'b00111111 <br> 8'b01111111 <br> 8'b11111111 | 180 <br> . <br> . <br> . <br> . <br> . <br> . <br> 225 | 4'b1010 <br> (Interval_5) | 8'b00000000 <br> 8'b00000001 <br> 8'b00000011 <br> 8'b00000111 <br> 8'b00001111 <br> 8'b00011111 <br> 8'b00111111 <br> 8'b01111111 <br> 8'b11111111 |
| 45 <br> . <br> . <br> . <br> . <br> . <br> . <br> 90 | 4'b0001 <br> (Interval_2) | 8'b11111111 <br> 8'b01111111 <br> 8'b00111111 <br> 8'b00011111 <br> 8'b00001111 <br> 8'b00000111 <br> 8'b00000011 <br> 8'b00000001 <br> 8'b00000000 | 225 <br> . <br> . <br> . <br> . <br> . <br> . <br> 270 | 4'b1011 <br> (Interval_6) | 8'b11111111 <br> 8'b01111111 <br> 8'b00111111 <br> 8'b00011111 <br> 8'b00001111 <br> 8'b00000111 <br> 8'b00000011 <br> 8'b00000001 <br> 8'b00000000 |
| 90 <br> . <br> . <br> . <br> . <br> . <br> . <br> 135 | 4'b0101 <br> (Interval_3) | 8'b00000000 <br> 8'b00000001 <br> 8'b00000011 <br> 8'b00000111 <br> 8'b00001111 <br> 8'b00011111 <br> 8'b00111111 <br> 8'b01111111 <br> 8'b11111111 | 270 <br> . <br> . <br> . <br> . <br> . <br> . <br> 315 | 4'b1111 <br> (Interval_7) | 8'b00000000 <br> 8'b00000001 <br> 8'b00000011 <br> 8'b00000111 <br> 8'b00001111 <br> 8'b00011111 <br> 8'b00111111 <br> 8'b01111111 <br> 8'b11111111 |
| 135 <br> . <br> . <br> . <br> . <br> . <br> . <br> 180 | 4'b0110 <br> (Interval_4) | 8'b11111111 <br> 8'b01111111 <br> 8'b00111111 <br> 8'b00011111 <br> 8'b00001111 <br> 8'b00000111 <br> 8'b00000011 <br> 8'b00000001 <br> 8'b00000000 | 315 <br> . <br> . <br> . <br> . <br> . <br> . <br> 360 | 4'b1100 <br> (Interval_8) | 8'b11111111 <br> 8'b01111111 <br> 8'b00111111 <br> 8'b00011111 <br> 8'b00001111 <br> 8'b00000111 <br> 8'b00000011 <br> 8'b00000001 <br> 8'b00000000 |

PHASE INTERPOLATOR FOR INTERPOLATING PHASE OF DELAY CLOCK SIGNAL AND DEVICE INCLUDING THE SAME AND FOR PERFORMING DATA SAMPLING BY USING PHASE INTERPOLATED CLOCK SIGNAL

CROSS-REFERENCE TO RELATED APPLICATION

This application claims the benefit of Korean Patent Application No. 10-2016-0162295, filed on Nov. 30, 2016, in the Korean Intellectual Property Office, the disclosure of which is incorporated herein in its entirety by reference.

BACKGROUND

1. Field

At least some example embodiments of the inventive concepts relate to a phase interpolator, and more particularly, to a phase interpolator for effectively interpolating a phase of a delay clock signal and a device including the same.

2. Related Art

In spite of improvements of speed of peripheral devices, such as memory, communication devices, or graphic devices, and a data transmission rate, operating speeds of peripheral devices have not kept up with an operating speeds of processors, in some cases. Further, a speed difference between new microprocessors and their peripheral devices is often present. Thus, some high performance digital systems have been required to dramatically improve speed of peripheral devices.

For example, like a data transmission between a memory device and a memory controller, in an input and output method of transmitting data by synchronizing a clock signal, a load of a bus increases and a transmission frequency becomes faster. Thus it is very important to temporally synchronize the clock signal and data. To this end, a phase locked loop (PLL) circuit, a delay locked loop (DLL) circuit, etc. are used. The PLL and the DLL generally include a phase interpolator. The phase interpolator is a circuit that appropriately controls two selection delay clock signals of different phases and generates an optional delay clock signal between the two selection delay clock signals. The phase interpolator is used in various application circuits since it can precisely output a desired phase.

SUMMARY

At least some example embodiments of the inventive concepts provide a phase interpolator that reduces a glitch and improves a circuit design size and a device including the same.

According to at least some example embodiments of the inventive concepts, a phase interpolator includes a control circuit configured to generate a selection control signal that corresponds to a selected coarse phase interval, and generate a weight setting signal for generating a phase interpolation clock signal with an interpolated phase within the coarse phase interval; a phase selector configured to receive a plurality of inversion delay clock signal pairs, select at least two inversion delay clock signal pairs from the plurality of inversion delay clock signal pairs based on the selection control signal, select and output a selection delay clock signal pair corresponding to the coarse phase interval from the selected at least two inversion delay clock signal pairs; and a phase mixer configured to receive the selection delay clock signal pair from the phase selector and generate the phase interpolation clock signal based on the weight setting signal.

According to at least some example embodiments of the inventive concepts, a phase interpolator includes a phase selector configured to select and output a first selection delay clock signal and a second selection delay clock signal that correspond to a coarse phase interval; and a phase mixer configured to generate a phase interpolation clock signal with an interpolated phase within the coarse phase interval, wherein the phase selector includes, a first selector configured to receive first inversion delay clock signal pairs, select the first selection delay clock signal and a first selection delay clock inversion signal from the first inversion delay clock signal pairs, and output the first selection delay clock signal and the first selection delay clock inversion signal to the phase mixer; and a second selector configured to receive second inversion delay clock signal pairs, select the second selection delay clock signal and a second selection delay clock inversion signal from the second inversion delay clock signal pairs, and output the second selection delay clock signal and the second selection delay clock inversion signal to the phase mixer.

According to at least some example embodiments of the inventive concepts, an apparatus includes a phase interpolator including, a signal generator configured to generate a phase interpolation clock signal with an interpolated phase within a coarse phase interval, and a control circuit configured to provide a selection control signal for selecting the coarse phase interval and a weight setting signal for generating the phase interpolation clock signal to the signal generator; and a data sampler configured to sample a data stream by using the phase interpolation clock signal and generate sample data, wherein the control circuit is configured to generate the weight setting signal including a safe code when a value of the selection control signal is changed.

According to at least some example embodiments of the inventive concepts, a phase interpolator including a phase selector configured to, receive a plurality of clock signals, the plurality of clock signals including at least four first clock signals and at least four inverted clock signals corresponding to the at least four first clock signals, respectively, the at least four first clock signals having at least four different phases, respectively, the at least four inverted clock signals having phases that are inverted with respect to the phases of the corresponding signals from among the at least four first clock signals, respectively, receive a selection control signal, and select and output, as a selection delay clock signal pair, two of the at least four first clock signals, based on the selection control signal; a phase mixer configured to, receive the selection delay clock signal pair, and generate a phase interpolation clock signal having a phase within a coarse phase range based on the selection delay clock signal pair and a weight setting signal.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims.

The accompanying drawings are not to be considered as drawn to scale unless explicitly noted.

FIG. 3 is a detailed block diagram of a phase selector of a phase interpolator according to at least one example embodiment of the inventive concepts;

FIG. 4B is a diagram of an example of a selection control signal applied to the phase selector of FIG. 3;

FIG. 9 is a diagram for describing an operation of preventing a glitch performed by a control circuit of FIG. 6 according to at least one example embodiment of the inventive concepts;

DETAILED DESCRIPTION OF THE EMBODIMENTS

Figure 1:
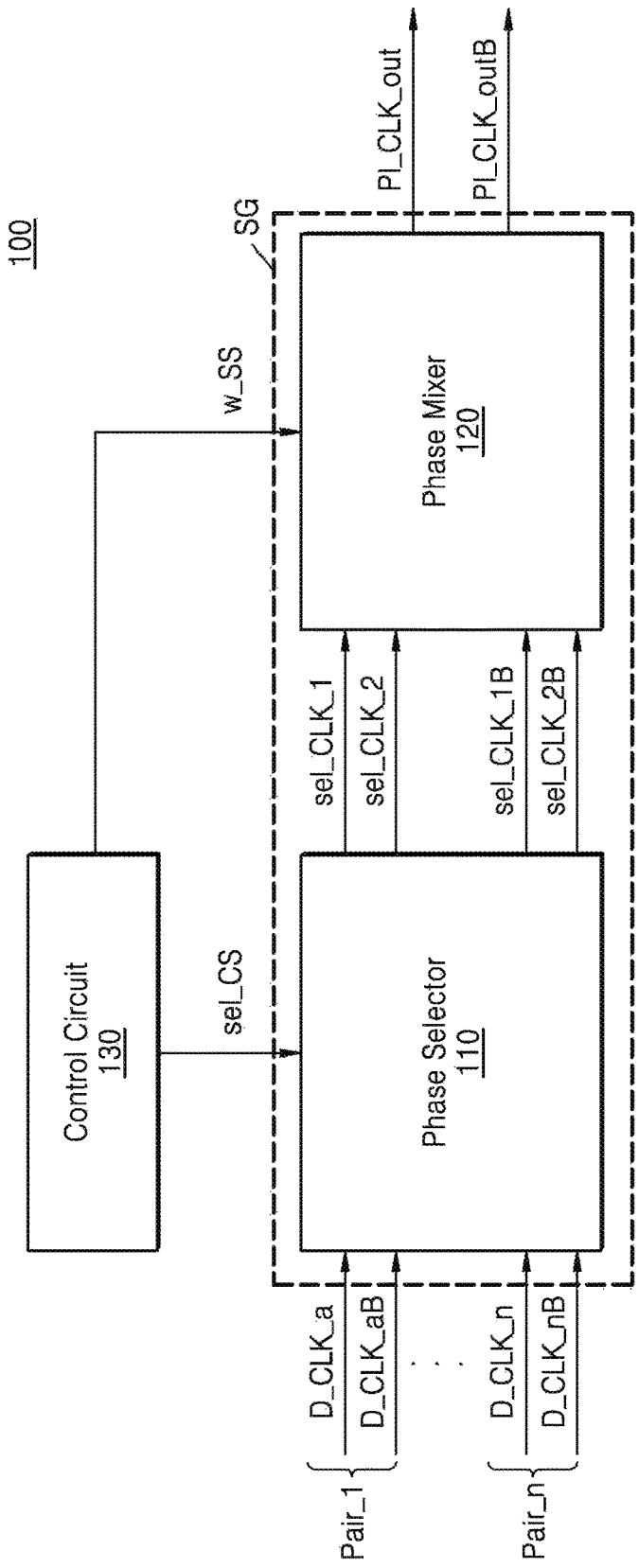
FIG. 1 is a block diagram of a phase interpolator according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a phase interpolator 100 according to at least one example embodiment of the inventive concepts.

Referring to FIG. 1, the phase interpolator 100 may receive a plurality of delay clock signals D_CLK_a~D_CLK_n, D_CLK_aB~D_CLK_nB from outside the phase interpolator 100 and may perform a phase interpolation operation by using the plurality of delay clock signals D_CLK_a~D_CLK_n, D_CLK_aB~D_CLK_nB, thereby generating a phase interpolated clock signal PI_CLK_out having various interpolated phases. The plurality of delay clock signals D_CLK_a~D_CLK_n, D_CLK_aB~D_CLK_nB may be generated by uniformly or non-uniformly distributing a delay phase corresponding to a clock signal cycle to a desired or, alternatively, predetermined clock signal and delaying the clock signal through a plurality of delay units. The plurality of delay clock signals D_CLK_a~D_CLK_n and D_CLK_aB~D_CLK_nB may be may be generated by a reference block signal generator, which will be described in detail below. For example, when a phase corresponding to a clock signal cycle is divided into eight equal parts, the delay clock signals D_CLK_a~D_CLK_n may include a total of 4 signals which respectively have phases of 0 degrees, 90 degrees, 45 degrees, and 135 degrees, and the delay clock inversion signals D_CLK_aB~D_CLK_nB may include a total of 4 signals which respectively have phases of 180 degrees, 270 degrees, 225 degrees, and 315 degrees. However, at least some example embodiments of the inventive concepts are not limited to the example phases discussed above. For example, the delay clock signals D_CLK_a~D_CLK_nB may be generated with various delay phases by variously distributing the delay phase corresponding to the clock signal cycle and may be provided to the phase interpolator 100.

The phase interpolator 100 may include a phase selector 110, a phase mixer 120, and a control circuit 130. The phase selector 110 and phase mixer 120 may each include, or be implemented by, one or more circuits or circuitry. Example phase selector and phase mixer circuits according to at least some example embodiments of the inventive concepts are discussed in greater detail below with reference to at least FIGS. 3 and 7A-8C. A configuration including the phase selector 110 and the phase mixer 120 may be referred to as a signal generator SG. However, the arrangement in FIG. 1 is merely an example embodiment. For example, according to at least some example embodiments of the inventive concepts, the control circuit 130 may be implemented separately from the phase interpolator 100. The phase interpolator 100 including the control circuit 130 will be described below. The phase selector 110 may receive a plurality of inversion delay clock signal pairs Pair_1~Pair_n from outside (e.g., outside the phase interpolator 100). That is, the phase selector 110 may receive inversion delay clock signal pair units including two delay clock signals with a semi-cycle delay phase difference. For example, a first delay clock signal D_CLK_a and a first delay clock inversion signal D_CLK_aB of the first inversion delay clock signal pair Pair_1 may have a phase difference of 180 degrees. Because, in the example shown in FIG. 1, there are a total of 4 delay clock signals D_CLK_a~D_CLK_n and a total of 4 delay clock inversion signals D_CLK_aB~D_CLK_nB, there are a total of 4 inversion delay clock signal pairs Pair_1~Pair_n. Based on a selection control signal sel_CS received from the control circuit 130, the phase selector 110 may select, from the delay clock signals D_CLK_a~D_CLK_n, a selection delay clock signal pair (sel_CLK_1, sel_CLK_2) corresponding to a coarse phase interval, and select, from the delay clock inversion signals D_CLK_aB~D_CLK_nB, a pair of delay clock inversion signals, (sel_CLK_1B, sel_CLK_2B), that are inverted with respect to the selection delay clock signal pair (sel_CLK_1, sel_CLK_2). Further, the phase selector 110 may output the inversion delay clock signal pairs, (sel_CLK_1, sel_CLK_1B) and (sel_CLK_2, sel_CLK_2B), to the phase mixer 120. Thus, in the manner described above, the phase selector 110 may select two signal pairs, from among the inversion delay clock signal pairs Pair_1~Pair_n, and output the two selected signal pairs to the phase mixer 120. The coarse phase interval may be selected by the control circuit 130. This will be described in detail with reference to FIG. 4A.

The phase mixer 120 may receive the selection delay clock signal pair (sel_CLK_1, sel_CLK_2) and generate a phase interpolation clock signal PI_CLK_out based on a weight setting signal w_SS received from the control signal 130. The phase mixer 120 may generate the phase interpolation clock signal PI_CLK_out with an interpolated phase within a delay phase range bounded by a delay phase of the first selection delay clock signal sel_CLK_1 and a delay phase of the second selection delay clock signal sel_CLK_2. Also, the phase mixer 120 may receive a first selection delay clock inversion signal sel_CLK_1B having an inversion relationship with the first selection delay clock signal sel_CLK_1 and a second selection delay clock inversion signal sel_CLK_2B having an inversion relationship with the second selection delay clock signal sel_CLK_2 and may generate a phase interpolation clock inversion signal PI_CLK_outB having an inversion relationship with the phase interpolation clock signal PI_CLK_out based on the weight setting signal w_SS received from the control circuit 130.

The control circuit 130 may select the coarse phase interval, generate the selection control signal sel_CS, and provide the selection control signal sel_CS to the phase selector 110 so as to control the phase selector 110 to select the selection delay clock signal pair (sel_CLK_1, sel_CLK_2) corresponding to the coarse phase interval. Also, the control circuit 130 may generate the weight setting signal w_SS for generating the phase interpolation clock signal PI_CLK_out with the interpolated phase within the coarse phase interval and provide the weight setting signal w_SS to the phase mixer 120 so as to control the phase mixer 120 to generate the phase interpolation clock signal PI_CLK_out by using the selection delay clock signal pair (sel_CLK_1, sel_CLK_2) and the weight setting signal w_SS. Furthermore, the control circuit 130 may control the phase mixer 120 to generate the phase interpolation clock inversion signal PI_CLK_outB by using the selection delay clock inversion signal pair (sel_CLK_1B, sel_CLK_2B) and the weight setting signal w_SS.

The phase interpolator 100 according to at least some example embodiments of the inventive concepts may receive the inversion delay clock signal pairs Pair_1~Pair_n and select at least two inversion delay clock signal pairs from the inversion delay clock signal pairs Pair_1~Pair_n, thereby efficiently generating the phase interpolation clock signal PI_CLK_out and the phase interpolation clock inversion signal PI_CLK_outB by using the selected inversion delay clock signal pairs and reducing a circuit design size with respect to the phase interpolator 100.

Figure 2:
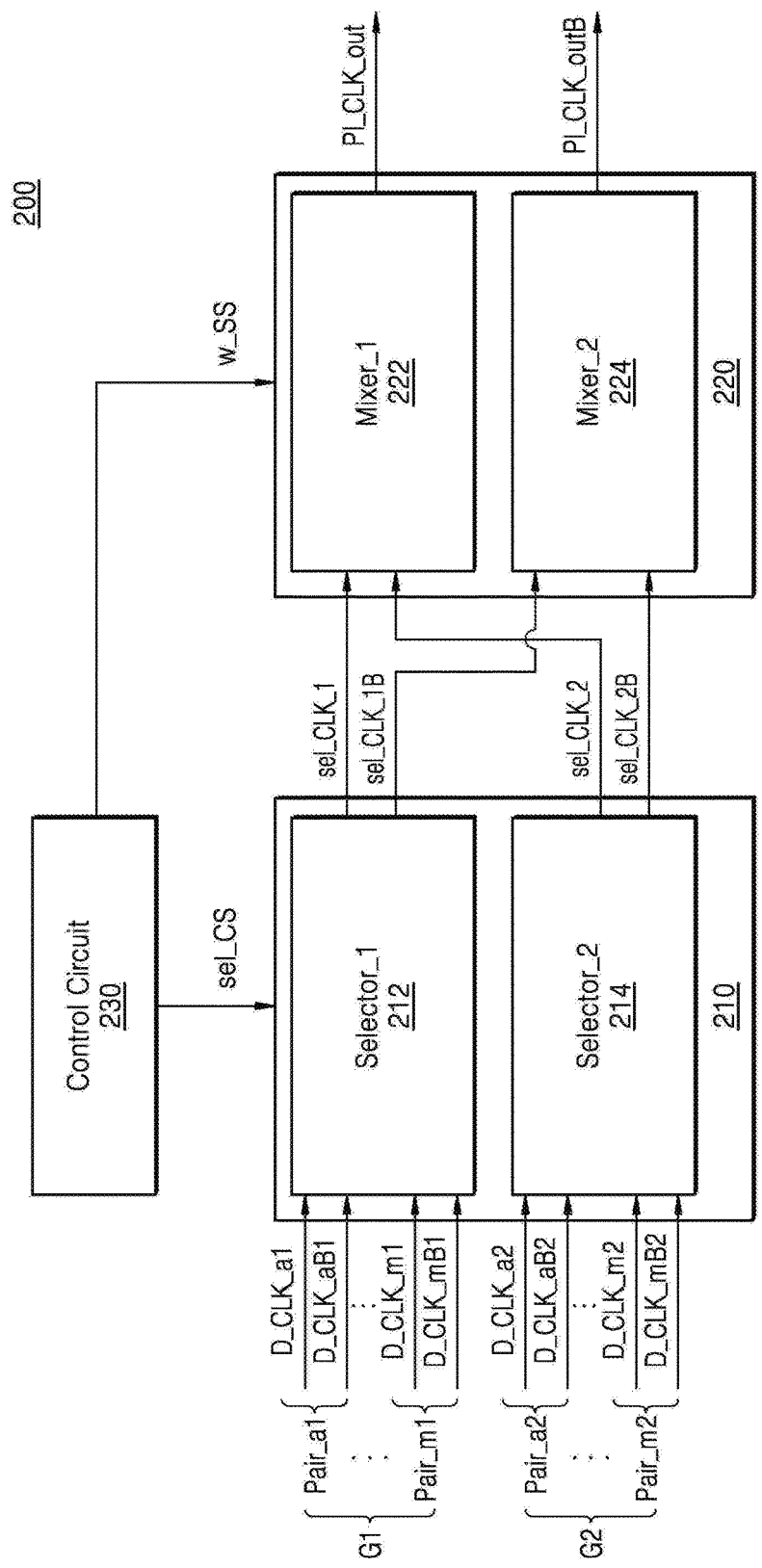
FIG. 2 is a block diagram of a phase interpolator according to at least one other example embodiment of the inventive concepts.

FIG. 2 is a block diagram of a phase interpolator 200 according to at least one other example embodiment of the inventive concepts.

Referring to FIG. 2, the phase interpolator 200 may include a phase selector 210, a phase mixer 220, and a control circuit 230. The phase selector 210 and phase mixer 220 may each include, or be implemented by, one or more circuits or circuitry. Example phase selector and phase mixer circuits according to at least some example embodiments of the inventive concepts are discussed in greater detail below with reference to at least FIGS. 3 and 7A-8C. The phase selector 210 may include a first selector 212 Selector_1 that receives first inversion delay clock signal pairs G1 including signal pairs Pair_a1_~Pair_m1 and a second selector 214 Selector_2 that receives second inversion delay clock signal pairs G2 including signal pairs Pair_a2_~Pair_m2. According to at least some example embodiments, the first inversion delay clock signal pairs G1 include m delay clock signals D_CLK_a1~D_CLK_m1 paired, respectively, with m delay clock inversion signals D_CLK_aB1~D_CLK_mB1. Further, the second inversion delay clock signal pairs G2 include m delay clock signals D_CLK_a2~D_CLK_m2 paired, respectively, with m delay clock inversion signals D_CLK_aB2~D_CLK_mB2. According to at least some example embodiments, m is a positive integer greater than 1. A phase difference between the first inversion delay clock signal pairs G1 may be the same as a phase difference between the second inversion delay clock signal pairs G2. The phase difference between the first inversion delay clock signal pairs G1 may refer to a phase difference between delay clock signals D_CLK_a1~D_CLK_m1 included in the first inversion delay clock signal pairs G1. Also, the phase difference between the second inversion delay clock signal pairs G2 may refer to a phase difference between delay clock signals D_CLK_a2~D_CLK_m2 included in the second inversion delay clock signal pairs G2. Also, according to at least one example embodiment of the inventive concepts, each of the phase difference between the first inversion delay clock signal pairs G1 and the phase difference between the second inversion delay clock signal pairs G2 may be greater than a coarse phase interval space. This will be described in detail with reference to FIGS. 3 and 4A The first selector 212 may select, from among the delay clock signals and delay clock inversion signals input to the first selector 212, the first selection delay clock signal sel_CLK_1 corresponding to the coarse phase interval and the first selection delay clock inversion signal sel_CLK_1B based on the selection control signal sel_CS received from the control circuit 230 and may output the first selection delay clock signal sel_CLK_1 and the first selection delay clock inversion signal sel_CLK_1B to the phase mixer 220. Inverted versions of signals described in the present disclosure are represented by adding the capital letter "B" to the labels of the signals. For example, the inverted version of the first selection delay clock signal sel_CLK_1 is the first selection delay clock inversion signal sel_CLK_1B. The second selector 214 may select the second selection delay clock signal sel_CLK_2 corresponding to the coarse phase interval and the second selection delay clock inversion signal sel_CLK_2B based on the selection control signal sel_CS and may output the second selection delay clock signal sel_CLK_2 and the second selection delay clock inversion signal sel_CLK_2B to the phase mixer 220.

The phase mixer 220 may include a first mixer 222 Mixer_1 that generates the phase interpolation clock signal PI_CLK_out and a second mixer 224 Mixer_2 that generates the phase interpolation clock inversion signal PI_CLK_outB. Thus, the first selector 212 may output the selected first selection delay clock signal sel_CLK_1 to the first mixer 222 and the selected first selection delay clock inversion signal sel_CLK_1B to the second mixer 224. Also, the second selector 214 may output the selected second selection delay clock signal sel_CLK_2 to the first mixer 222 and the selected second selection delay clock inversion signal sel_CLK_2B to the second mixer 224. The first mixer 222 may generate the phase interpolation clock signal PI_CLK_out by using the first selection delay clock signal sel_CLK_1 and the second selection delay clock signal sel_CLK_2 based on the weight setting signal w_SS received from the control circuit 230. The second mixer 224 may generate the phase interpolation clock inversion signal PI_CLK_outB by using the first selection delay clock inversion signal sel_CLK_1B and the second selection delay clock inversion signal sel_CLK_2B based on the weight setting signal w_SS.

Figure 4A:
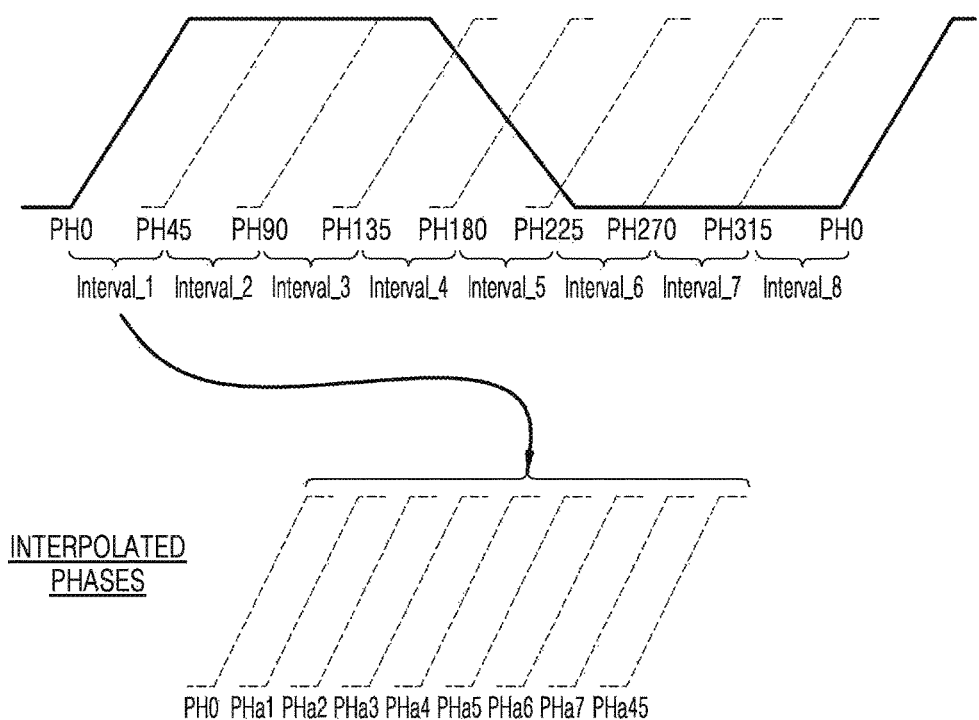
FIG. 4A is a diagram for describing a coarse phase interval and an interpolation phase according to at least one example embodiment of the inventive concepts.

FIG. 3 is a detailed block diagram of a phase selector 210a of a phase interpolator 200a according to at least one example embodiment of the inventive concepts. FIG. 4A is a diagram for describing a coarse phase interval and an interpolation phase according to at least one example embodiment of the inventive concepts. FIG. 4B is a diagram of an example of a selection control signal sel_CS<3:0> applied to the phase selector 210a of FIG. 3.

At least some example embodiments of the inventive concepts will be described below with respect to an example scenario in which the delay clock signals D_CLK sequentially have phases of 0 degree, 45 degrees, 90 degrees, 135 degrees, 180 degrees, 225 degrees, 270 degrees, 315 degrees, and 360 degrees. However, at least some example embodiments of the inventive concepts are not limited to the example scenario provided above, and the discussions herein referring to the above-referenced example scenario may also be applied to other scenarios in which any or all of the phases of the delay clock signals D_CLK received by the phase interpolator have values that differ from the values of the phases of the example scenario.

Referring to FIG. 3, the phase interpolator 200a may include the phase selector 210a and a phase mixer 220a. According to at least some example embodiments of the inventive concepts, the phase interpolator 200a illustrates an example structure of the phase interpolator 200 of FIG. 2. The phase mixer 220a may include, or be implemented by, one or more circuits or circuitry. Example phase mixer circuits according to at least some example embodiments of the inventive concepts are discussed in greater detail below with reference to at least FIGS. 7A-8C. The phase selector 210a may include a first selector 212a and a second selector 214a. According to at least one example embodiment of the inventive concepts, the first selector 212a may include a first differential MUX 212a_1, a first MUX 212a_2, and a second MUX 212a_3. The second selector 214a may include a second differential MUX 214a_1, a third MUX 214a_2, and a fourth MUX 214a_3.

Further, referring to FIG. 4A, one coarse phase interval that may be selected by a control circuit may have a phase difference of 45 degrees. That is, the control circuit may select a first coarse phase interval Interval_1 and provide the selection control signal sel_CS that matches the first coarse phase interval Interval_1 to the phase selector 210a. The phase selector 210a may select a selection delay clock signal with a 0 degree phase PH0 and a selection delay clock signal with a 45 degree phase PH45. Also, the control circuit may select a second coarse phase interval Interval_2 and provide the selection control signal sel_CS that matches the second coarse phase interval Interval_2 to the phase selector 210a. The phase selector 210a may select a selection delay clock signal with a 45 degree phase PH45 and a selection delay clock signal with a 90 degree phase PH90. In this way, the phase selector 210a may select selection delay clock signals corresponding to first through eight coarse phase intervals Interval_1~Interval_8 based on the selection control signal sel_CS. As is illustrated in FIG. 4A, according to at least some example embodiments, each coarse phase interval may be a range of phase values (e.g., delay phase values). For example Interval_1 may be a range of phase values between 0 degrees and 45 degrees. As another example, Interval_4 may be a range of phase values between 135 degrees and 180 degrees. Coarse phase intervals may also be referred to in the present disclosure as coarse phase ranges.

As a result of performing a phase interpolation operation in the phase mixer 220a based on the weight setting signal w_SS, phase interpolator 200a may generate a phase interpolation clock signal with an interpolated phase within a selected coarse phase interval. For example, when the first coarse phase interval Interval_1 is selected, the phase mixer 220a may generate a phase interpolation clock signal with one of a plurality of interpolated phases PH0, PHa1, PHa2, PHa3, PHa4, PHa5, PHa6, PHa7, and PH45 from 0 degree to 45 degrees based on the weight setting signal w_SS. According to at least one example embodiment of the inventive concepts, spaces between the plurality of interpolated phases PH0, PHa1, PHa2, PHa3, PHa4, PHa5, PHa6, PHa7, and PH45 may or may not be equal. Further, according to the number of bits of the weight setting signal w_SS, the number of interpolated phases that may be generated by the phase mixer 220a may be different. That is, as the number of bits of the weight setting signal w_SS increases, the number of interpolated phases that may be generated by the phase mixer 220a may increase. This will be described in detail later. The phase interpolation operation using the coarse phase interval selected by the phase mixer 220a may be referred to as a fine phase adjustment operation.

Referring to FIG. 3, the first differential MUX 212a_1 may receive a first inversion delay clock signal pair Pair_a1 and a second inversion delay clock signal pair Pair_b1. The first inversion delay clock signal pair Pair_a1 may include a first delay clock signal D_CLK_0 with a 0 degree phase and a first delay clock inversion signal D_CLK_180 with a 180 degree phase. The second inversion delay clock signal pair Pair_b1 may include a second delay clock signal D_CLK_90 with a 90 degree phase and a second delay clock inversion signal D_CLK_270 with a 270 degree phase. The second differential MUX 214a_1 may receive a third inversion delay clock signal pair Pair_a2 and a fourth inversion delay clock signal pair Pair_b2. The third inversion delay clock signal pair Pair_a2 may include a third delay clock signal D_CLK_45 with a 45 degree phase and a third delay clock inversion signal D_CLK_225 with a 225 degree phase. The fourth inversion delay clock signal pair Pair_b2 may include a fourth delay clock signal D_CLK_135 with a 135 degree phase and a fourth delay clock inversion signal D_CLK_315 with a 315 degree phase.

As described with reference to FIG. 2, a phase difference of the first delay clock signal D_CLK_0 and the second delay clock signal D_CLK_90 that are received by the first differential MUX 212a_1 may be the same as a phase difference of the third delay clock signal D_CLK_45 and the fourth delay clock signal D_CLK_135 that are received by the second differential MUX 214a_1. Also, as shown in FIG. 4A, when a gap of one coarse phase interval is 45 degrees, the phase difference of the first delay clock signal D_CLK_0 and the second delay clock signal D_CLK_90 and the phase difference of the third delay clock signal D_CLK_45 and the fourth delay clock signal D_CLK_135 may be 90 degrees (i.e., the phase difference may be greater than the gap of one coarse phase interval, which is 45 degrees in the example shown in FIG. 4A). The first selector 212a and the second selector 214a may receive the inversion delay clock signal pairs Pair_a1, Pair_b1, Pair_a2, and Pair_b2 having the relationship described above, and thus the first selector 212a may select the first selection delay clock signal sel_CLK_1 corresponding to the selected coarse phase interval and the first selection delay clock inversion signal sel_CLK_1B, and the second selector 214a may select the second selection delay clock signal sel_CLK_2 corresponding to the selected coarse phase interval and the second selection delay clock inversion signal sel_CLK_2B.

Referring to a table Table_1 of FIG. 4B, the selection control signal sel_CS<3:0> generated by the control circuit may be a 4 bit signal. According to at least one example embodiment of the inventive concepts, when the control circuit selects the first coarse phase interval Interval_1 of FIG. 4A, the control circuit may generate the selection control signal sel_CS<3:0> and provide the selection control signal sel_CS<3:0> to the phase selector 210a. Thereafter, the first differential MUX 212a_1 may select the first inversion delay clock signal pair Pair_a1 based on a selection control signal sel_CS<0> and may provide the first inversion delay clock signal pair Pair_a1 to the first MUX 212a_2 and the second MUX 212a_3. The first MUX 212a_2 may select the first delay clock signal D_CLK_0 as the first selection delay clock signal sel_CLK_1 based on a selection control signal sel_CS<1> and may provide the first delay clock signal D_CLK_0 to the first mixer 222_1. The second MUX 212a_3 may select the first delay clock inversion signal D_CLK_180 as the first selection delay clock inversion signal sel_CLK_1B based on the selection control signal sel_CS<1> and may provide first delay clock inversion signal D_CLK_180 to the second mixer 224_a. The second differential MUX 214a_1 may select the third inversion delay clock signal pair Pair_a2 based on a selection control signal sel_CS<2> and may provide the third inversion delay clock signal pair Pair_a2 to the third MUX 241a_2 and the fourth MUX 214a_3. The third MUX 241a_2 may select the third delay clock signal D_CLK_45 as the second selection delay clock signal sel_CLK_2 based on a selection control signal sel_CS<3> and may provide the third delay clock signal D_CLK_45 to the first mixer 222_a. The fourth MUX 214a_3 may select the third delay clock inversion signal D_CLK_225 as the second selection delay clock inversion signal sel_CLK_2B based on the selection control signal sel_CS<3> and may provide the third delay clock inversion signal D_CLK_225 to the second mixer 224_a.

According to at least some example embodiments of the inventive concepts, when the control circuit (e.g., the control circuit 230) selects from the first coarse phase interval Interval_1 to the second coarse phase interval Interval_2, the control circuit (e.g., the control circuit 230) may generate the selection control signal sel_CS<3:0> having a value of 4'b001 and may provide the selection control signal sel_CS<3:0> to the phase selector 210a. In the same manner as described above, the first selector 212a may select the second delay clock signal D_CLK_90 as the first selection delay clock signal sel_CLK_1, provide the second delay clock signal D_CLK_90 to the first mixer 222a, select the second delay clock inversion signal D_CLK_270 as the first selection delay clock inversion signal sel_CLK_1B, provide the second delay clock inversion signal D_CLK_270 to the second mixer 224a. The second selector 214a, as described above, may select the third delay clock signal D_CLK_45 as the second selection delay clock signal sel_CLK_2, provide the third delay clock signal D_CLK_45 to the first mixer 222a, select the third delay clock inversion signal D_CLK_225 as the second selection delay clock inversion signal sel_CLK_2B, and provide the third delay clock inversion signal D_CLK_225 to the second mixer 224a.

In the same manner as described above, the phase selector 210a may select the first selection delay clock signal sel_CLK_1 and the second selection delay clock signal sel_CLK_2 corresponding to the selected coarse phase section based on the selection control signal sel_CS<3:0> and may provide the first selection delay clock signal sel_CLK_1 and the second selection delay clock signal sel_CLK_2 to the phase mixer 220a. Furthermore, the phase selector 210a may select the first selection delay clock inversion signal sel_CLK_1B and the second selection delay clock inversion signal sel_CLK_2B, identify the selection delay clock signals sel_CLK_1, sel_CLK_2, and may provide the first selection delay clock inversion signal sel_CLK_1B and the second selection delay clock inversion signal sel_CLK_2B to the phase mixer 220a.

Figure 5:
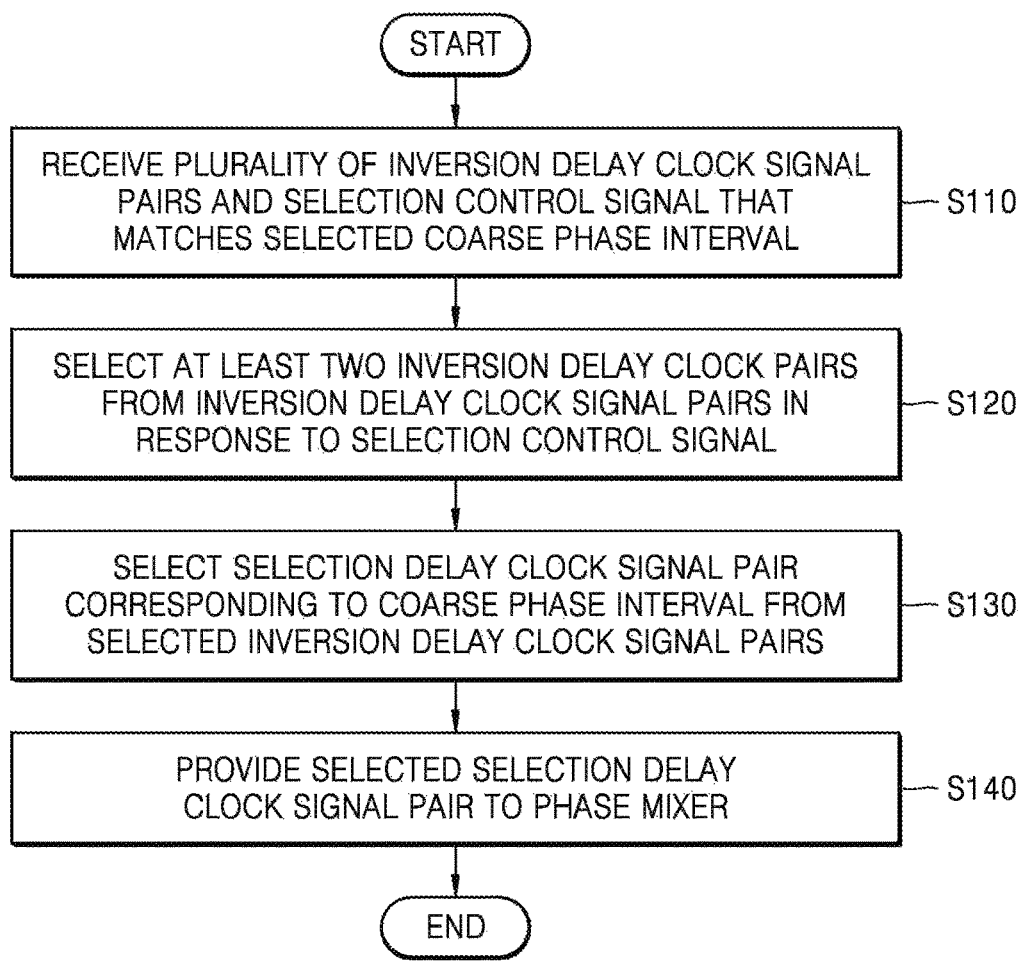
FIG. 5 is a flowchart for describing an operation of selecting a selection delay clock signal pair of a phase selector according to at least one example embodiment of the inventive concepts.

FIG. 5 is a flowchart for describing an operation of selecting a selection delay clock signal pair of a phase selector according to at least one example embodiment of the inventive concepts.

Referring to FIG. 5, the phase selector may receive a plurality of inversion delay clock signal pairs and a selection control signal that matches a selected coarse phase interval (operation S110). The phase selector may select at least two inversion delay clock pairs from the inversion delay clock signal pairs in response to the selection control signal (operation S120). The phase selector may select the selection delay clock signal pair corresponding to the coarse phase interval from the selected inversion delay clock signal pairs (operation S130). The phase selector may provide the selected selection delay clock signal pair to a phase mixer (operation S140). Thereafter, the phase mixer may generate a phase interpolation clock signal by using the selection delay clock signal pair.

Figure 6:
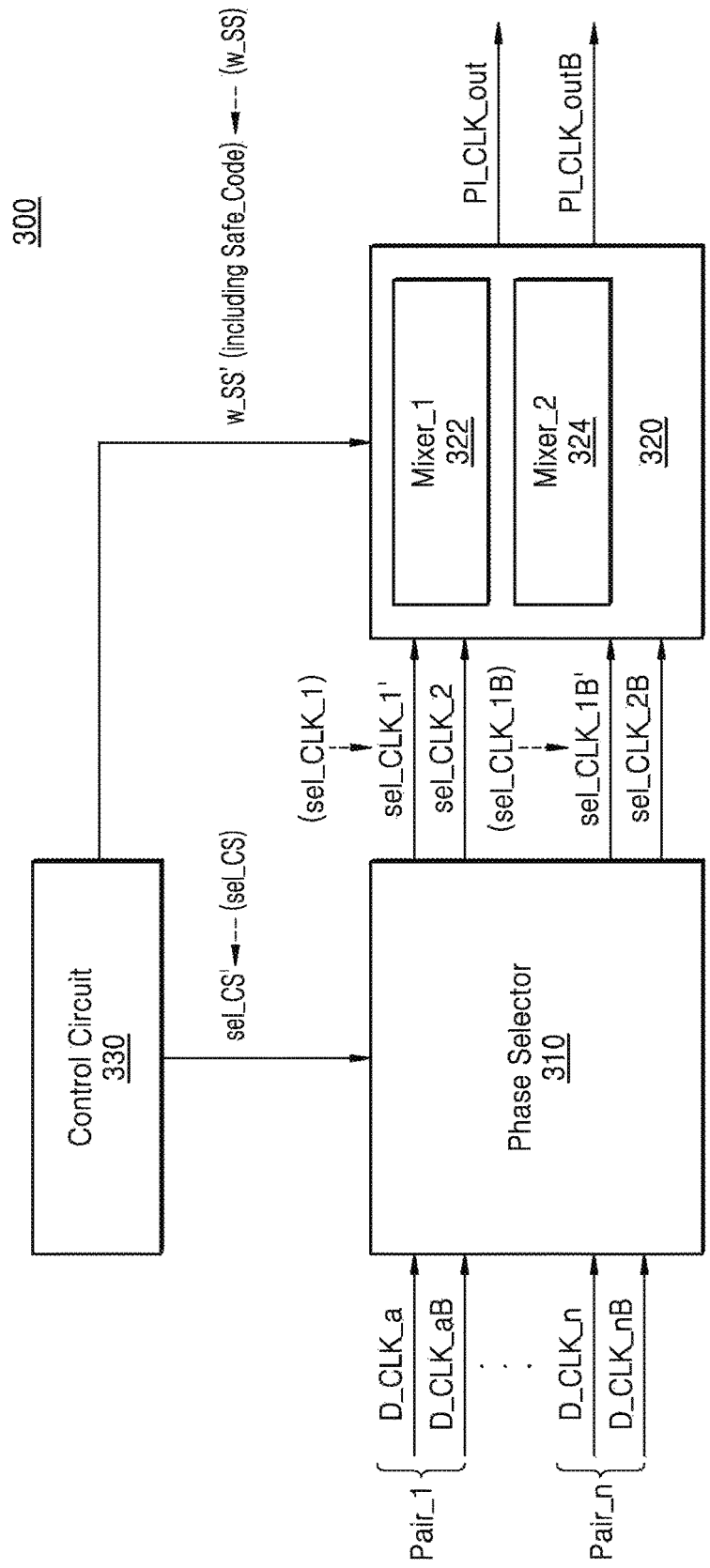
FIG. 6 is a block diagram of a phase interpolator for preventing a glitch according to at least one example embodiment of the inventive concepts.

FIG. 6 is a block diagram of a phase interpolator 300 for preventing a glitch according to at least one example embodiment of the inventive concepts.

Referring to FIG. 6, the phase interpolator 300 may include a phase selector 310, a phase mixer 320, and a control circuit 330. The phase selector 310 and phase mixer 320 may each include, or be implemented by, one or more circuits or circuitry. Example phase selector and phase mixer circuits according to at least some example embodiments of the inventive concepts are discussed in greater detail herein with reference to at least FIGS. 3 and 7A-8C. The phase mixer 320 may include a first mixer 322 and a second mixer 324. The control circuit 330 according to at least one example embodiment of the inventive concepts may prevent the selection control signal sel_CS and the weight setting signal w_SS from being simultaneously changed. According to at least one example embodiment of the inventive concepts, the control circuit 330 may select one of the selection control signal sel_CS and the weight setting signal w_SS in order to control a phase interpolation operation of the phase interpolator 300 and change a value. Specifically, when the control circuit 330 selects a different coarse phase interval, change a selection control signal sel_CS' that matches the selected coarse phase interval, and provides the selection control signal sel_CS' to the phase selector 310, the control circuit 330 may generate a weight setting signal w_SS' including a safe code Safe_Code and may provide the weight setting signal w_SS' to the phase mixer 320. According to at least one example embodiment of the inventive concepts, the safe code Safe_Code may be the same as a value of the weight setting signal w_SS generated immediately before the selection control signal sel_CS' is changed.

The phase selector 310 may select selection delay clock signals sel_CLK_1', sel_CLK_2 based on the changed selection control signal sel_CS' and may provide the selection delay clock signals sel_CLK_1', sel_CLK_2 to the first mixer 322. The first mixer 322 may generate the signal PI_CLK_out that is the same as a phase interpolation clock signal generated immediately before the selection control signal sel_CS' is changed, based on the weight setting signal w_SS' including the safe code Safe_Code. Also, the phase selector 310 may select selection delay clock inversion signals sel_CLK_1B', sel_CLK_2B based on the changed selection control signal sel_CS' and may provide the selection delay clock inversion signals sel_CLK_1B', sel_CLK_2B to the second mixer 324. The second mixer 324 may generate the signal PI_CLK_outB that is the same as the phase interpolation clock signal generated immediately before the selection control signal sel_CS' is changed, based on the weight setting signal w_SS' including the safe code Safe_Code.

The control circuit 330 according to the present embodiment may change only one of the selection control signal sel_CS and the weight setting signal w_SS, and thus the glitch generated due to a change of signals may be reduced or, alternatively, minimized, thereby efficiently controlling the phase interpolation operation of the phase interpolator 300.

Figure 7A:
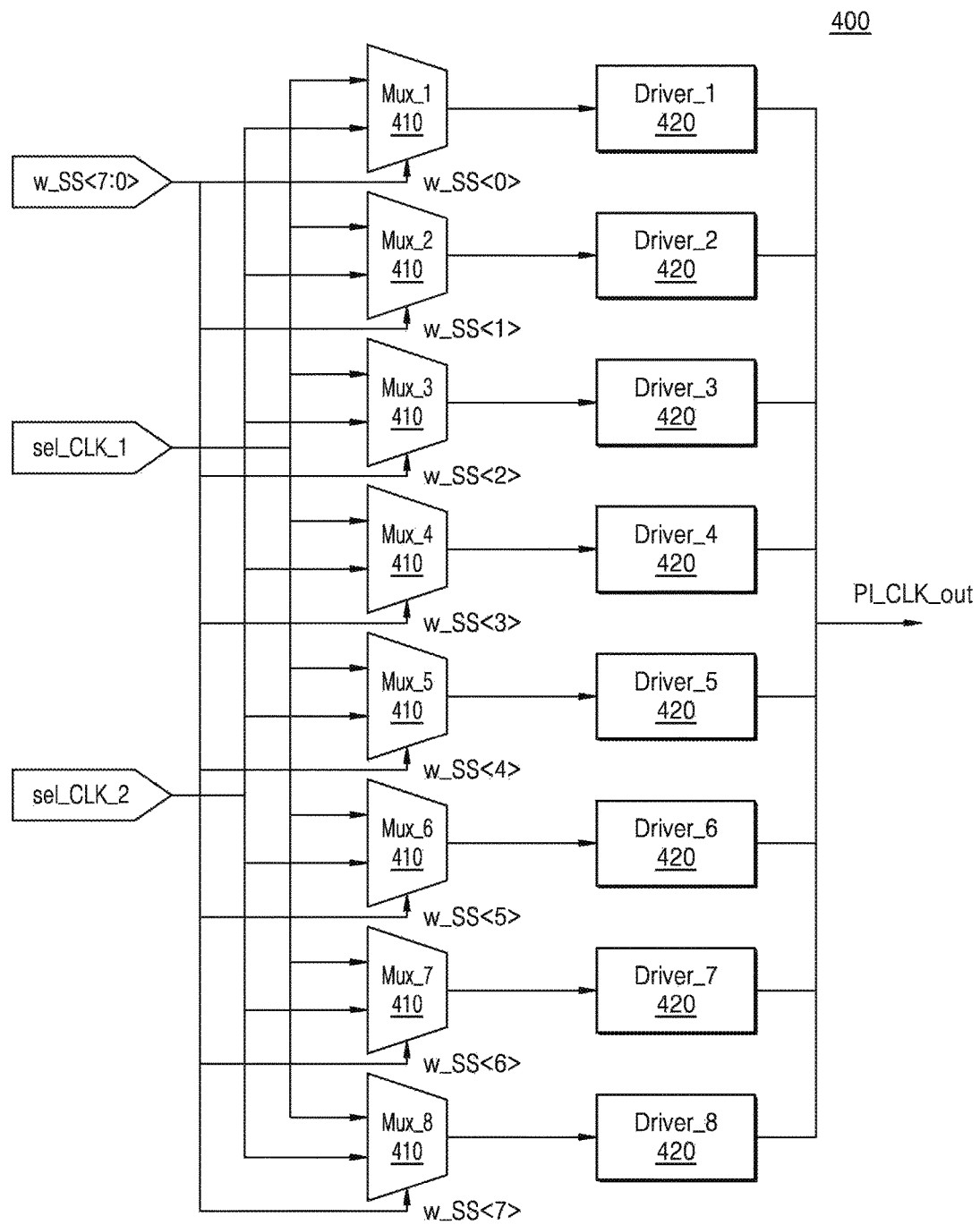
FIG. 7A is a detailed block diagram of a first mixer included in a phase mixer of FIG. 2 according to at least one example embodiment of the inventive concepts.
Figure 7B:
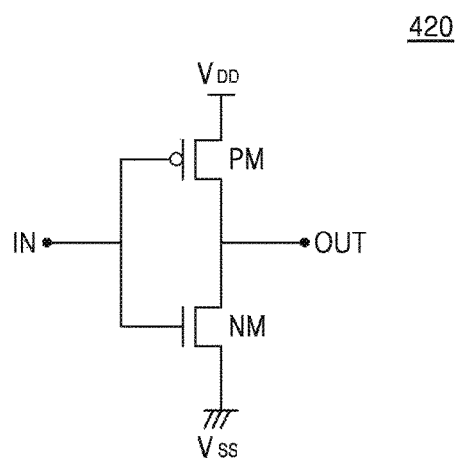
FIG. 7B is a detailed circuit diagram of a driver included in a phase mixer according to at least one example embodiment of the inventive concepts.

FIG. 7A is a detailed block diagram of a first mixer 400 included in the phase mixer 220 of FIG. 2 according to at least one example embodiment of the inventive concepts. FIG. 7B is a detailed circuit diagram of a driver 420 included in the phase mixer 220 according to at least one example embodiment of the inventive concepts.

Referring to FIG. 7A, the first mixer 400 may include a plurality of MUXes 410 and a plurality of drivers 420. According to at least one example embodiment of the inventive concepts, the first mixer 400 may include various numbers of the plurality of MUXes 410 and the plurality of drivers 420 according to the number of phases of the phase interpolation clock signal PI_CLK_out that may be generated by the first mixer 400 based on the weight setting signal w_SS. For example, the first mixer 400 may include more numbers of the MUXes 410 and the drivers 420 as the number of interpolated phases that may be generated based on the weight setting signal w_SS increases. In FIG. 7A, a weight setting signal w_SS<7:0>) may be an 8 bit signal, and accordingly, an example embodiment including the 8 MUXes 410 and the 8 drivers 420 is illustrated. However, this is merely an example embodiment and is not limited thereto. The first mixer 400 may include various numbers of MUXes 410 and the drivers 420. Also, the first and second mixers 222 and 224 included in the phase mixer 220 of FIG. 2 may each have the same configuration as the first mixer 400 of FIG. 7A.

The MUXes 410 may receive the first selection delay clock signal sel_CLK_1 and the second selection delay clock signal sel_CLK_2 that are selected by a phase selector, and a weight setting signal w_SS<n>. The MUXes 410 may select one of the first selection delay clock signal sel_CLK_1 and the second selection delay clock signal sel_CLK_2 based on the weight setting signal w_SS<n>. The MUXes 410 may respectively provide selected selection delay clock signals to the drivers 420. As described above, the drivers 420 may generate the phase interpolation clock signal PI_CLK_out by using the selected selection delay clock signals.

Referring to FIG. 7B, the driver 420 may be implemented as a CMOS inverter. Specifically, the driver 420 may include a PMOS transistor PM connected to a power voltage $V_{DD}$ and an NMOS transistor NM connected to a ground voltage $V_{SS}$. A selection delay clock signal may be input to an input terminal IN of the driver 420 from each of the MUXes 410 and an output terminal OUT may be connected to the power voltage $V_{DD}$ and the ground voltage $V_{SS}$ according to a level status of the selection delay clock signal, and thus an output signal may be generated and may be output through the output terminal OUT. The first mixer 400 may generate the phase interpolation clock signal PI_CLK_out through output signals of the drivers 420.

Figure 8A:
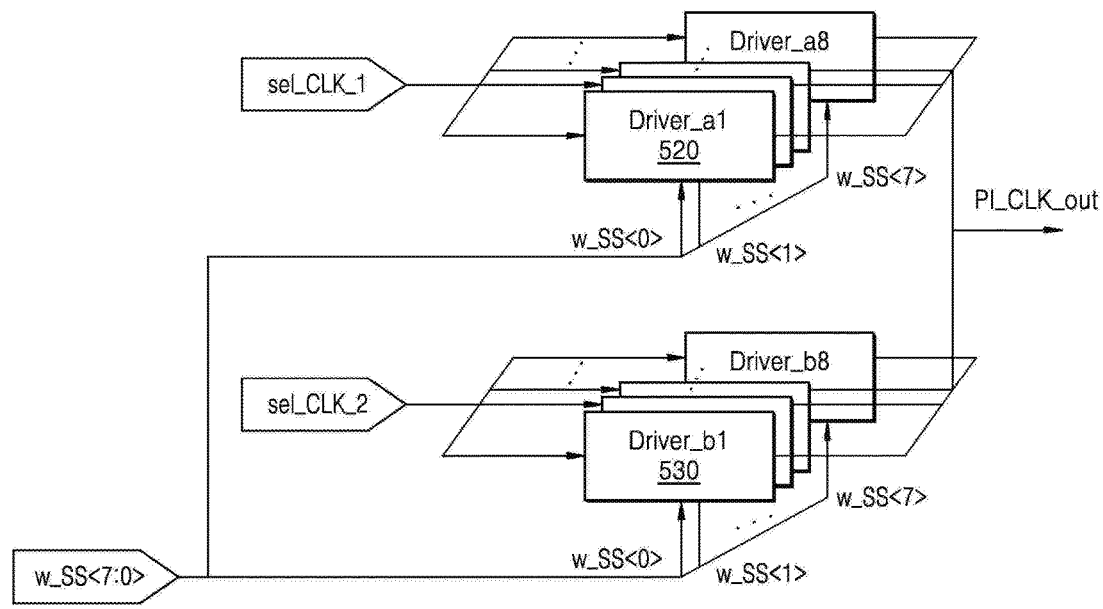
FIG. 8A is a detailed block diagram of a first mixer included in a phase mixer of FIG. 2 according to at least one other example embodiment of the inventive concepts.
Figure 8B:
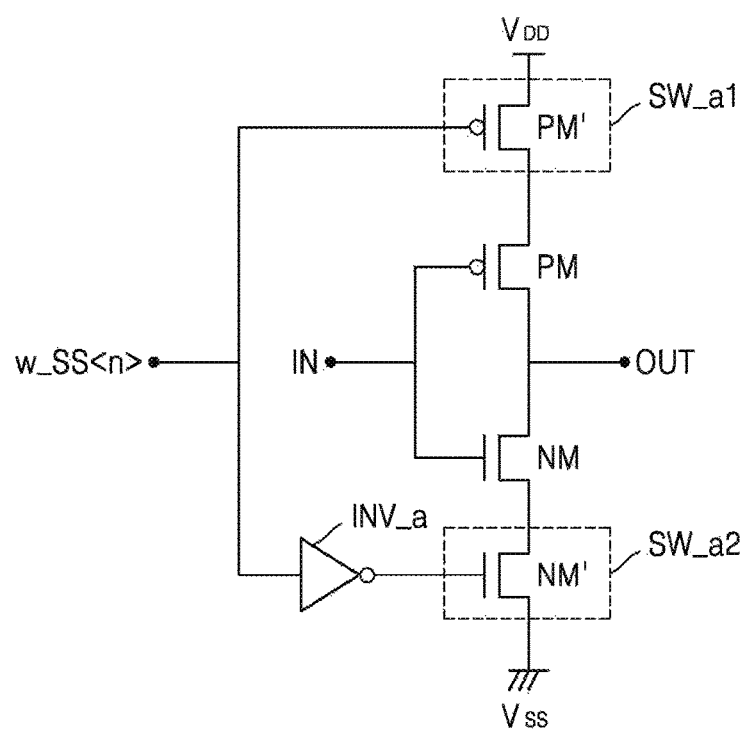
FIGS. 8B and 8C are detailed circuit diagrams of drivers included in a phase mixer according to at least one other example embodiment of the inventive concepts.
Figure 8C:
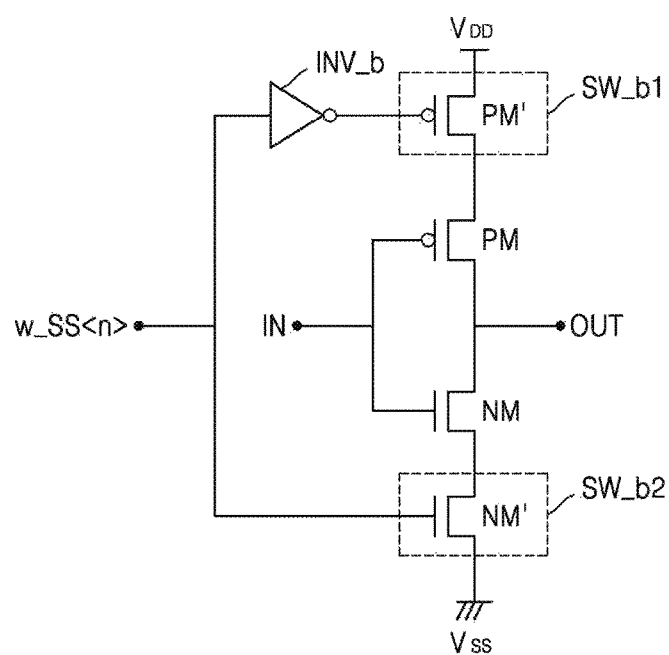

FIG. 8A is a detailed block diagram of a first mixer 500 included in the phase mixer 220 of FIG. 2 according to at least one other example embodiment of the inventive concepts. FIGS. 8B and 8C are detailed circuit diagrams of drivers 520 and 530, respectively, included in the phase mixer 220 according to at least one other example embodiment of the inventive concepts.

Referring to FIG. 8A, the first mixer 500 may not include a MUX unlike the first mixer 400 of FIG. 7A and may include the drivers 520 and 530. According to at least one example embodiment of the inventive concepts, the first mixer 500 may include various numbers of the drivers 520 and 530 according to the number of phases of the phase interpolation clock signal PI_CLK_out that may be generated based on the weight setting signal w_SS. In FIG. 8A, the weight setting signal w_SS<7:0> may be an 8 bit signal, and accordingly, an example embodiment including the 8 first drivers 520 and the 8 second drivers 530 is illustrated. However, this is merely an example embodiment and is not limited thereto. The first mixer 500 may include various numbers of the drivers 520 and 530. Also, the second mixer 224 included in the phase mixer 222 of FIG. 2 may have the same configuration as the first mixer 500 of FIG. 8A.

The first driver 520 may receive the first selection delay clock signal sel_CLK_1 selected by a phase selector and the weight setting signal w_SS<n>. The first driver 520 may be selectively enabled or disabled based on the weight setting signal w_SS<n>. When the first driver 520 is enabled, the first driver 520 may generate a first output signal by using the first selection delay clock signal sel_CLK_1. The second driver 530 may receive the second selection delay clock signal sel_CLK_2 selected by the phase elector and the weight setting signal w_SS<n>. The second driver 530 may be selectively enabled or disabled based on the weight setting signal w_SS<n>. When the second driver 530 is enabled, the second driver 530 may generate a second output signal by using the second selection delay clock signal sel_CLK_2. The first mixer 500 may generate the phase interpolation clock signal PI_CLK_out through the first output signals and the second output signals of the drivers 520 and 530.

Referring to FIG. 8B, the first driver 520 may be implemented as a CMOS inverter. Specifically, the first driver 520 may include a PMOS transistor PM, an NMOS transistor NM, a first switch device SW_a1 connected between the power voltage $V_{DD}$ and the PMOS transistor PM, a second switch device SW_a2 connected between the ground voltage $V_{SS}$ and the NMOS transistor NM, and an inverter INV_a. According to at least one example embodiment of the inventive concepts, the first switch device SW_a1 may be implemented as a PMOS transistor PM', and the second switch device SW_a2 may be implemented as an NMOS transistor NM'. The first driver 520 may be enabled or disabled by the weight setting signal w_SS<n>. Specifically, the second switch device SW_a2 may be directly connected to the inverter INV_a, the weight setting signal w_SS<n> may be input to the first switch device SW_a1, and a signal of the weight setting signal w_SS<n> inverted by the inverter INV_a may be input to the second switch device SW_a2. The first driver 520 may be enabled or disabled through switching operations of the first switch device SW_a1 and the second switch device SW_a2 based on the weight setting signal w_SS<n>. For example, when the weight setting signal w_SS<n> is in a high level having a value '1', the first switch device SW_a1 and the second switch device SW_a2 may be turned off so that the first driver 520 may be disabled. Also, when the weight setting signal w_SS<n> is in a low level having a value '0', the first switch device SW_a1 and the second switch device SW_a2 may be turned on so that the first driver 520 may be enabled. The first selection delay clock signal sel_CLK_1 may be input to the input terminal IN of the first driver 520 and the output terminal OUT may be connected to the power voltage $V_{DD}$ and the ground voltage $V_{SS}$ according to a level status of the first selection delay clock signal sel_CLK_1, and thus the first output signal may be generated and output through the output terminal OUT.

Referring to FIG. 8C, the second driver 530 may have a similar configuration to that of the first driver 520 of FIG. 8B. Unlike the first driver 520, an inverter INV_b of the second driver 520 may be connected to a first switch device SW_b1. Thus, the weight setting signal w_SS<n> may be input to a second switch device SW_b2, and a signal of the weight setting signal w_SS<n> inverted by the inverter INV_b may be input to the first switch device SW_b1. Through such configuration, even when the same weight setting signal w_SS<n> is input to the first driver 520 and the second driver 530, the first driver 520 and the second driver 530 may have different statuses. The second selection delay clock signal sel_CLK_2 may be input to the input terminal IN of the second driver 530 and the output terminal OUT may be connected to the power voltage $V_{DD}$ and the ground voltage $V_{SS}$ according to a level status of the second selection delay clock signal sel_CLK_2, and thus the second output signal may be generated and output through the output terminal OUT.

Through the configuration that does not include MUXes of the first mixer 500 according to the present embodiment, the selection delay clock signals sel_CLK_1, sel_CLK_2 may be directly input to the drivers 520 and 530, respectively, without any MUXes, and thus signal lines from the phase selector to the drivers 520 and 530 may be reduced, thereby reducing or, alternatively, minimizing a clock distortion that occurs due to lengths of the signal lines.

Figure 10:
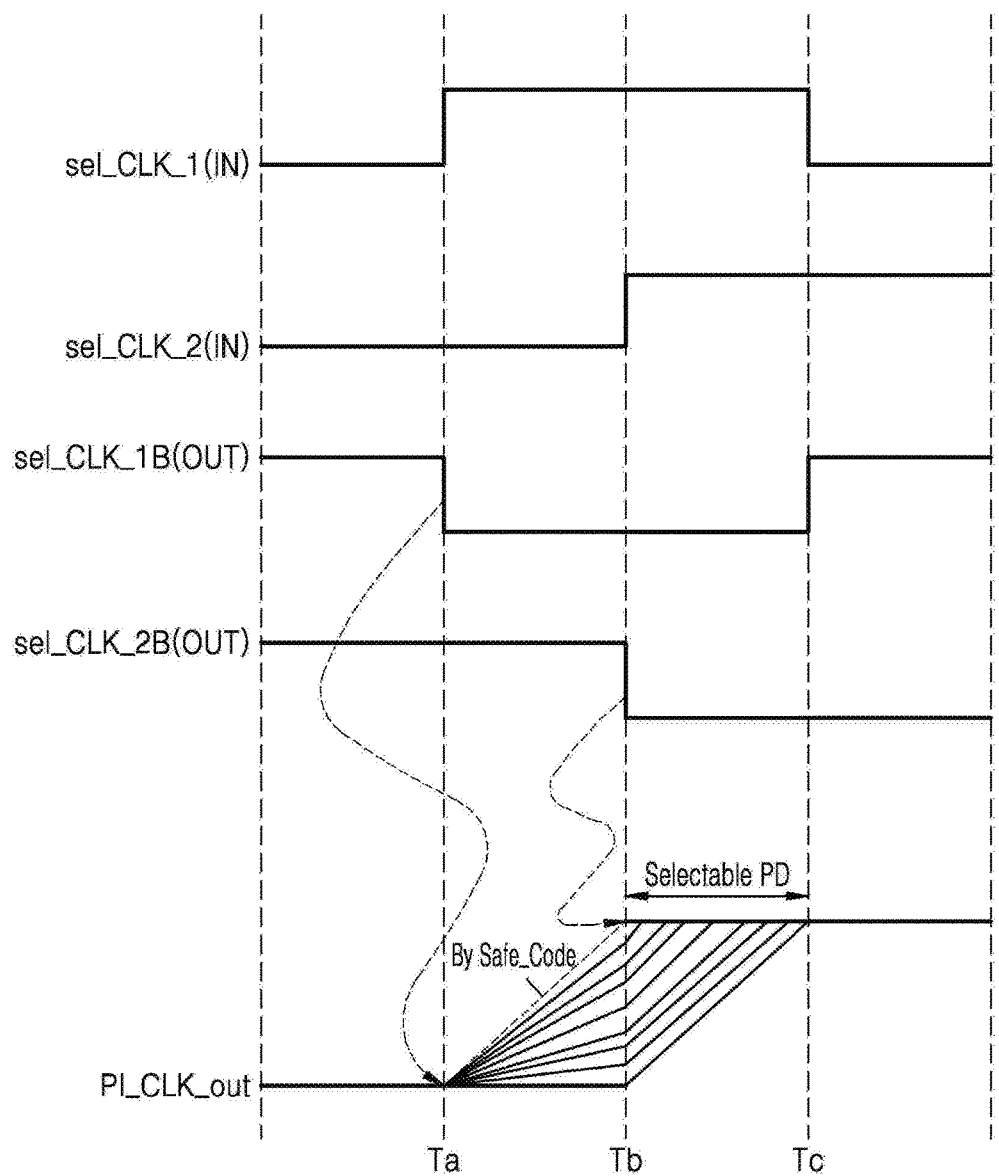
FIG. 10 is a graph for describing an operation of generating a phase interpolation clock signal through a phase interpolation operation control of a control circuit of FIG. 6 according to at least one example embodiment of the inventive concepts.

FIG. 9 is a diagram for describing an operation of preventing a glitch performed by the control circuit 330 of FIG. 6 according to at least one example embodiment of the inventive concepts. FIG. 10 is a graph for describing an operation of generating a phase interpolation clock signal through a phase interpolation operation control of the control circuit 330 of FIG. 6 according to at least one example embodiment of the inventive concepts.

Referring to FIG. 6 and a table Table_2 of FIG. 9, according to at least one example embodiment of the inventive concepts, the control circuit 330 may generate the selection control signal sel_CS and the weight setting signal w_SS to control a phase interpolation operation of the phase interpolator 300. The table Table_2 shows phases of the phase interpolation clock signal PI_CLK_out generated according to values of the selection control signal sel_CS and values of the weight setting signal w_SS. According to at least one example embodiment of the inventive concepts, the control circuit 330 may generate a multi-bit signal including 4 bit most significant bit (MSB) corresponding to the selection control signal sel_CS and an 8 bit least significant bit (LSB) corresponding to the weight setting signal w_SS. Also, the control circuit 330 may generate the selection control signal sel_CS as a binary code and the weight setting signal w_SS as a thermometer code.

Referring to FIG. 4A, for example, the control circuit 330 may select the first coarse phase interval Interval_1, generate the selection control signal sel_CS having a value of 4'b0000, and provide the selection control signal sel_CS to the phase selector 310. Also, the control circuit 330 may generate the weight setting signal w_SS and may provide the weight setting signal w_SS to the phase mixer 320. As described above, the control circuit 330 may select one of the coarse phase intervals Interval_1~Interval_8 to control the phase interpolation clock signal PI_CLK_out with an interpolated phase within the selected coarse phase interval to be generated.

According to at least one example embodiment of the inventive concepts, when the control circuit 330 selects a different coarse phase interval and changes the selection control signal sel_CS, the control circuit 330 may generate the weight setting signal w_SS including the safe code Safe_Code. Through this, the control circuit 330 may prevent the values of the selection control signal sel_CS and the weight setting signal w_SS from being simultaneously changed, thereby reducing or, alternatively, minimizing a glitch that may be generated due to a change of signals. The safe code Safe_Code may be the same as a value of the weight setting signal w_SS generated by the control circuit 330 immediately before the value of the selection control signal sel_CS is changed. Thus, when the control circuit 330 selects from the first coarse phase interval Interval_1 to the second coarse phase interval Interval_2 and changes the selection control signal sel_CS by 1 bit from b'0000 to b'0001, the control circuit 330 may generate the weight setting signal w_SS including the safe code Safe_Code having a value of 8'b11111111.

According to at least one example embodiment of the inventive concepts, when the phase mixer 320 receives the weight setting signal w_SS including the safe code Safe_Code from the control circuit 330, the phase mixer 320 may generate the same signal as the previously generated phase interpolation clock signal PI_CLK_out. For example, when the control circuit 330 provides the selection control signal sel_CS of 4'b0000 and the weight setting signal w_SS of 8'b11111111 to respectively the phase selector 310 and the phase mixer 320, the phase mixer 320 may generate the phase interpolation clock signal PI_CLK_out with a 45 degree phase. Then, when the control circuit 330 provides the selection control signal sel_CS of 4'b0001 and the weight setting signal w_SS including the safe code Safe_Code to respectively the phase selector 310 and the phase mixer 320, the phase mixer 320 may generate the phase interpolation clock signal PI_CLK_out with a 45 degree phase.

As described above, the control circuit 330 may sequentially change the multi-bit signal including the selection control signal sel_CS and the weight setting signal w_SS by 1 bit and provide the sequentially changed multi-bit signal to the phase selector 310 and the phase mixer 320, thereby controlling an interpolation operation. Since the values of the selection control signal sel_CS, the values of the weight setting signal w_SS, and the phases of the phase interpolation clock signal PI_CLK_out according to the values of the selection control signal sel_CS and the values of the weight setting signal w_SS shown in the table Table_2 are merely example embodiments and are not limited thereto. Various embodiments may be derived.

Referring to FIGS. 8A and 10, the first mixer 500 may generate the phase interpolation clock signal PI_CLK_out by using the first selection delay clock signal sel_CLK_1 and the second selection delay clock signal sel_CLK_2. Specifically, when a first selection delay clock inversion signal sel_CLK_1B(OUT) is transited from a high level to a low level at a first time Ta, the first drivers 520 that are enabled based on the weight setting signal w_SS may generate and output output signals. An inclination of the phase interpolation clock signal PI_CLK_out that is transited from the low level to the high level may be different according to the number of the first drivers 520 selected from the first time Ta to a second time Tb. Also, when a second selection delay clock inversion signal sel_CLK_2B (OUT) is transited from the high level to the low level at the second time Tb, the second drivers 530 that are enabled based on the weight setting signal w_SS may generate and output output signals. An inclination of the phase interpolation clock signal PI_CLK_out that is transited from the low level to the high level may be the same from the second time Tb to a third time Tc. Through an operation of the first mixer 500 described above, a phase of the phase interpolation clock signal PI_CLK_out may be selected. That is, the first mixer 500 may select one of selectable phases Selectable_PD and generate the phase interpolation clock signal PI_CLK_out with the selected phase.

The selectable phases Selectable_PD according to the present embodiment may have the same phase as those of the first selection delay clock signal sel_CLK_1 and the second selection delay clock signal sel_CLK_2 by using sing the weight setting signal w_SS including the safe code Safe_Code.

Figure 11:
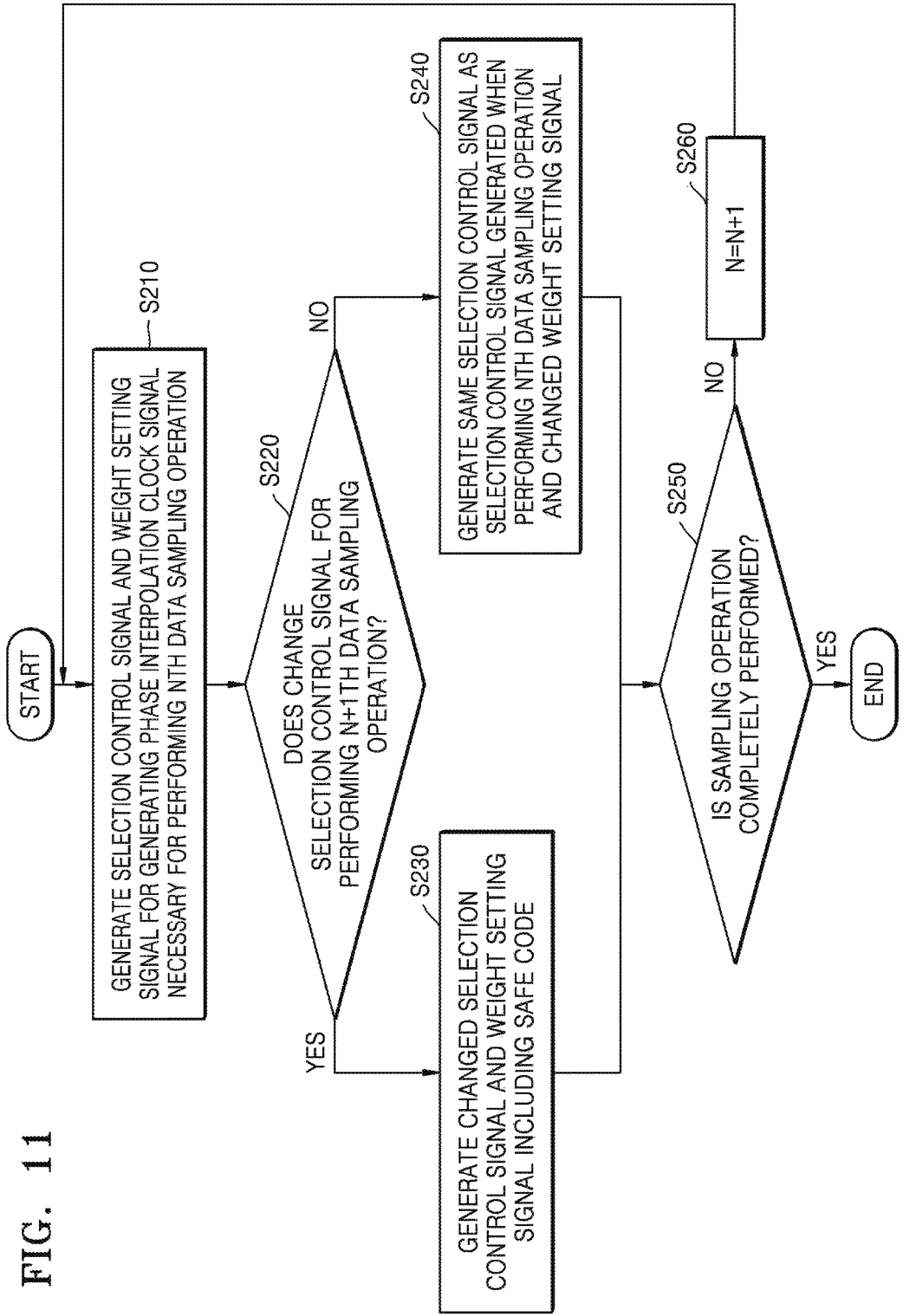
FIG. 11 is a flowchart for describing a signal generating method for a phase interpolation operation control of a control circuit according to at least one example embodiment of the inventive concepts.

FIG. 11 is a flowchart for describing a signal generating method for a phase interpolation operation control of a control circuit according to at least one example embodiment of the inventive concepts.

Referring to FIG. 11, the control circuit may generate a selection control signal and a weight setting signal for generating a phase interpolation clock signal necessary for performing an Nth data sampling operation (operation S210). Thereafter, the control circuit may determine whether to change the selection control signal for performing an N+1th data sampling operation (operation S220). When the selection control signal is changed (operation S220, YES), the control circuit may generate the changed selection control signal and the weight setting signal including a safe code (operation S230). When the selection control signal is not changed (operation S220, NO), the control circuit may generate the same selection control signal as the selection control signal generated when performing the Nth data sampling operation and the changed weight setting signal (operation S240). The control circuit may determine whether a sampling operation is completely performed (operation S250). When the control circuit completely performs the sampling operation (operation S250, YES), the control circuit may end the phase interpolation operation control. When the control circuit does not completely performs the sampling operation (operation S250, NO), the control circuit may perform a counting up operation on N (operation S260) and may generate a selection control signal and a weight setting signal for generating a phase interpolation clock signal necessary for performing a next data sampling operation.

Figure 12A:
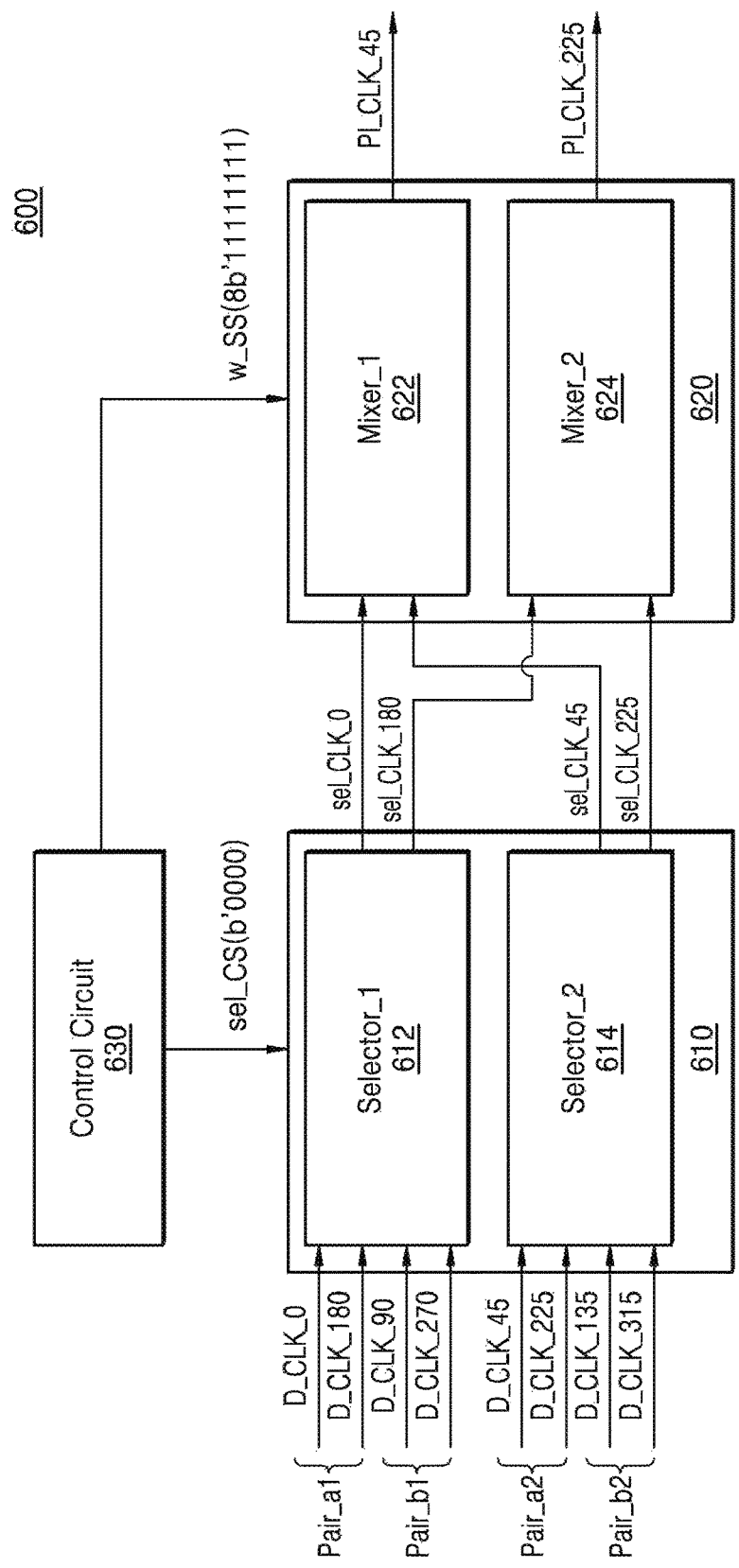
FIGS. 12A and 12B are diagrams for specifically describing an operation of a phase interpolator according to at least one example embodiment of the inventive concepts.
Figure 12B:
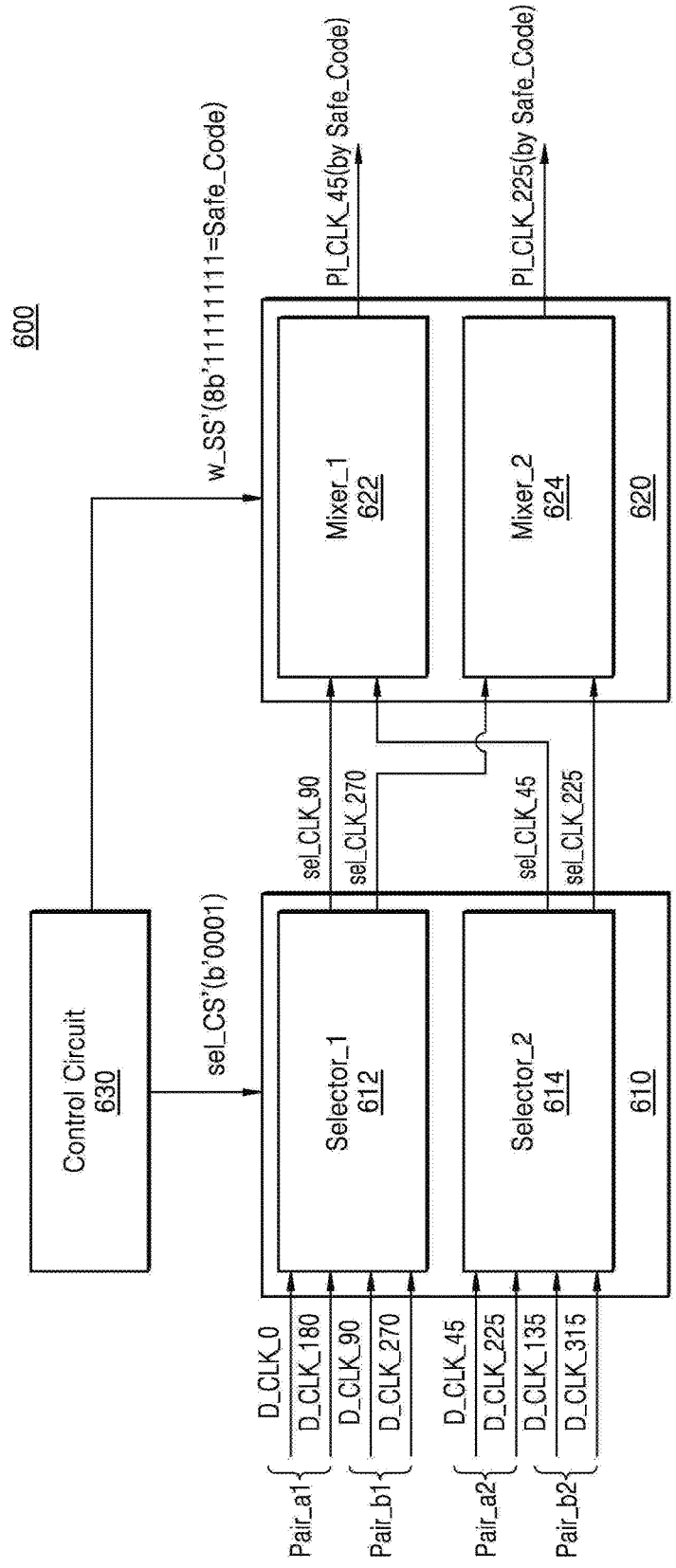

FIGS. 12A and 12B are diagrams for specifically describing an operation of a phase interpolator 600 according to at least one example embodiment of the inventive concepts.

Referring to FIG. 12A, the phase interpolator 600 may include a phase selector 610, a phase mixer 620, and a control circuit 630. The phase selector 610 and phase mixer 620 may each include, or be implemented by, one or more circuits or circuitry. Example phase selector and phase mixer circuits according to at least some example embodiments of the inventive concepts are discussed above with reference to at least FIGS. 3 and 7A-8C. The phase selector 610 may include a first selector 612 and a second selector 614. The phase mixer 620 may include a first mixer 622 and a second mixer 624. According to at least one example embodiment of the inventive concepts, the first selector 612 may receive the first inversion delay clock signal pair Pair_a1 and the second inversion delay clock signal pair Pair_b1. The second selector 614 may receive the third inversion delay clock signal pair Pair_a2 and the fourth inversion delay clock signal pair Pair_b2.

As shown in FIG. 9, the control circuit 630 may provide the selection control signal sel_CS having a value of b'0000 to the phase selector 610. The first selector 612 may select the first delay clock signal sel_CLK_0 and the first delay clock inversion signal sel_CLK_180 based on the selection control signal sel_CS. The first selector 612 may provide the first delay clock signal sel_CLK_0 to the first mixer 622 as a first selection delay clock signal and the first delay clock inversion signal sel_CLK_180 to the second mixer 624 as a first selection delay clock inversion signal. The second selector 614 may select the third delay clock signal sel_LK_45 and the third delay clock inversion signal sel_CLK_225 based on the selection control signal sel_CS. The second selector 614 may provide the third delay clock signal sel_CLK_45 to the first mixer 622 as a second selection delay clock signal and the third delay clock inversion signal sel_CLK_225 to the second mixer 624 as a second selection delay clock inversion signal.

The control circuit 630 may provide the weight setting signal w_SS having a value of 8b'11111111 to the phase mixer 620. The first mixer 622 may generate a phase interpolation clock signal PI_CLK_45 with a 45 degree phase based on the weight setting signal w_SS. The second mixer 624 may generate a phase interpolation clock signal PI_CLK_225 with a 225 degree phase based on the weight setting signal w_SS.

Referring to FIG. 12B, the control circuit 630 may select a different coarse phase interval and provide a selection control signal sel_CS' having a changed value of b'0001 to the phase selector 610. The first selector 612 may select the second delay clock signal sel_CLK_90 and the second delay clock inversion signal sel_CLK_270 based on the selection control signal sel_CS'. The first selector 612 may provide the second delay clock signal sel_CLK_90 to the first mixer 622 as a first selection delay clock signal and the second delay clock inversion signal sel_CLK_270 to the second mixer 624. The second selector 614 may perform the same operation as described with reference to FIG. 12A.

When the control circuit 630, as described above, changes the selection control signal sel_CS', the control circuit 630 may provide a weight setting signal w_SS' including the safe code Safe_Code to the phase mixer 620. According to at least one example embodiment of the inventive concepts, the safe code Safe_Code may have the same value as that of the weight setting signal w_SS generated with reference to FIG. 12A. The first mixer 622 may generate a phase interpolation clock signal PI_CLK_45 with a 45 degree phase that is the same as the phase interpolation clock signal generated with reference to FIG. 12A based on the weight setting signal w_SS'. Also, the second mixer 624 may generate a phase interpolation clock signal PI_CLK_225 with a 225 degree phase that is the same as the phase interpolation clock signal generated with reference to FIG. 12A based on the weight setting signal w_SS'.

Figure 13:
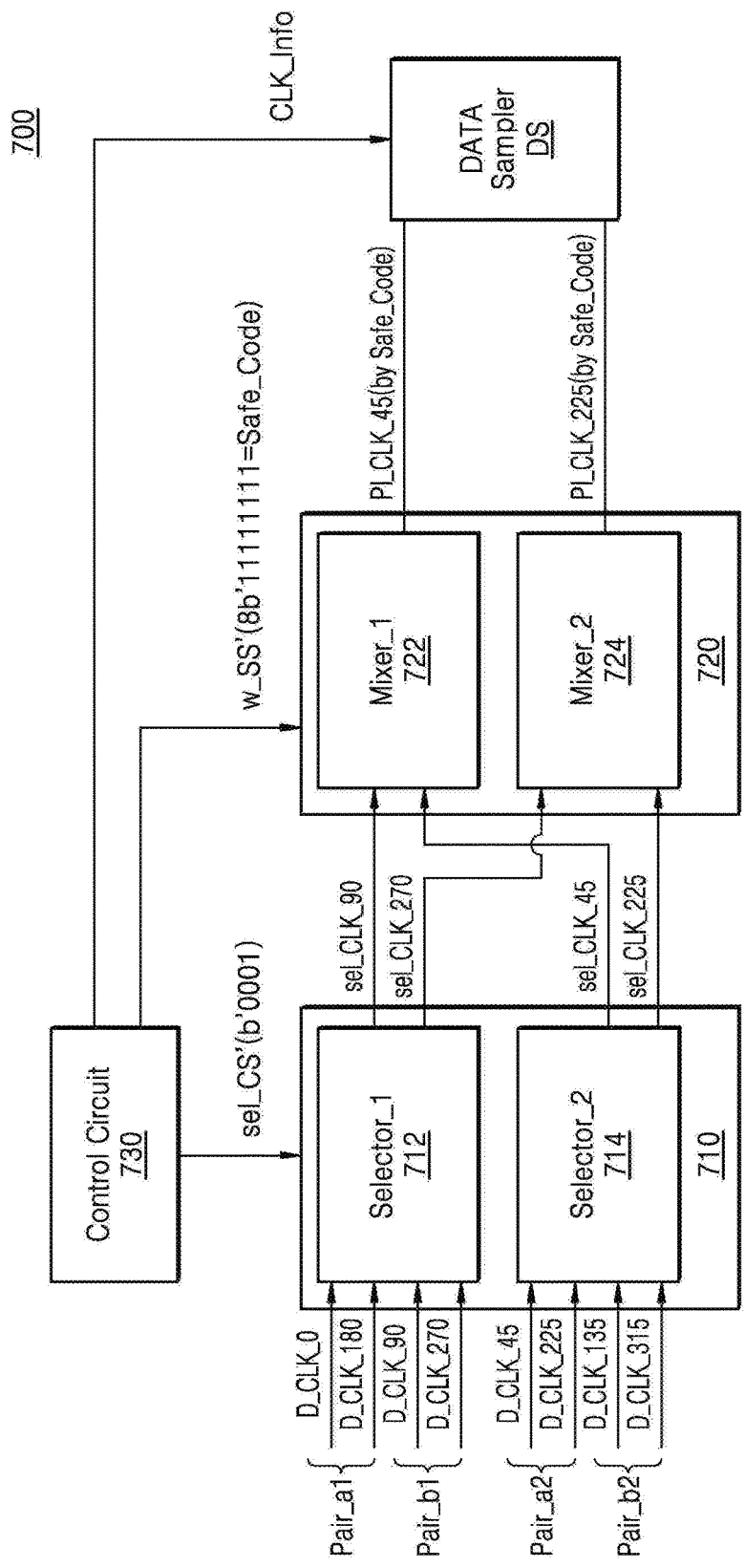
FIG. 13 is a block diagram for describing an operation of a control circuit for performing an efficient data sampling operation according to at least one example embodiment of the inventive concepts.

FIG. 13 is a block diagram for describing an operation of a control circuit 730 for performing an efficient data sampling operation according to at least one example embodiment of the inventive concepts.

Referring to FIG. 13, a phase interpolator 700 may include a phase selector 710, a phase mixer 720, and a control circuit 730. The phase selector 710 and phase mixer 720 may each include, or be implemented by, one or more circuits or circuitry. Example phase selector and phase mixer circuits according to at least some example embodiments of the inventive concepts are discussed above with reference to at least FIGS. 3 and 7A-8C. The control circuit 730 according to at least one example embodiment of the inventive concepts may provide clock information CLK_Info to a data sampler DS. The clock information CLK_Info may be information indicating whether a currently received phase interpolation clock signal has the same phase as a previously received phase interpolation clock signal. The data sampler DS may determine whether to perform a data sampling operation based on the clock information CLK_Info. Specifically, when it is determined that the currently received phase interpolation clock signal has the same phase as a previously received phase interpolation clock signal based on the clock information CLK_Info, the data sampler DS may skip the data sampling operation by using the phase interpolation clock signal.

In particular, when a phase interpolator is used as an eye opening monitor (EOM), through the above configuration, the phase interpolator 700 may allow the data sampler DS to efficiently perform the data sampling operation.

According to at least some example embodiments of the inventive concepts, the data sampler DS may include, or be implemented by, one or more circuits or circuitry.

Figure 14:
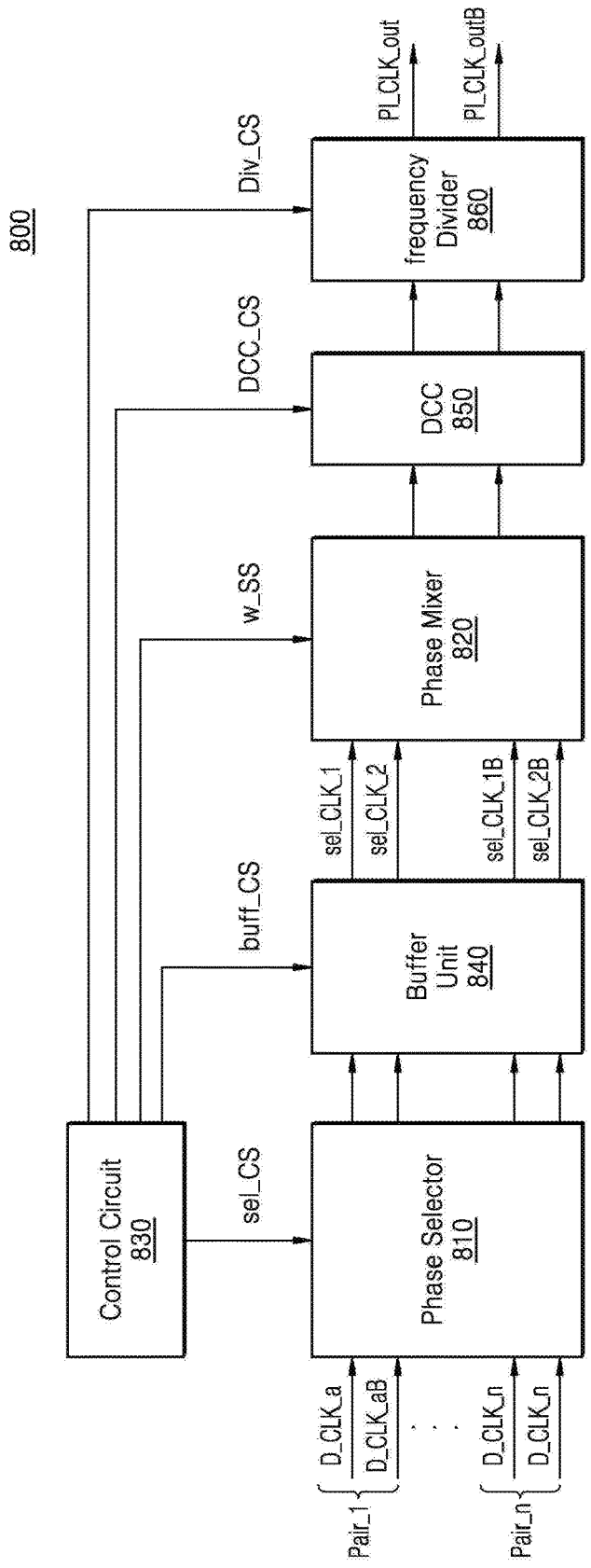
FIG. 14 is a block diagram of a phase interpolator according to at least one example embodiment of the inventive concepts.

FIG. 14 is a block diagram of a phase interpolator 800 according to at least one example embodiment of the inventive concepts.

Referring to FIG. 14, the phase interpolator 800 may include a phase selector 810, a phase mixer 820, a control circuit 830, a buffer 840, a duty cycle corrector (DCC) 850, and a frequency divider 860. The phase selector 810 and phase mixer 820, buffer 840, duty cycle corrector (DCC) 850, and frequency divider 860 may each include, or be implemented by, one or more circuits or circuitry. For example, example phase selector and phase mixer circuits according to at least some example embodiments of the inventive concepts are discussed above with reference to at least FIGS. 3 and 7A-8C. The buffer 840 may perform a buffering operation of adjusting a slew rate of the selection delay clock signal pair sel_CLK_1, sel_CLK_2 and the selection delay clock inversion signal pair sel_CLK_1B, sel_CLK_2B that are received from the phase selector 810 based on a buffering control signal buff_CS received from the control circuit 830. The DCC 850 may correct duty cycles of a phase interpolation clock signal and a phase interpolation clock inversion signal that are received from the phase mixer 820 based on a DCC control signal DCC_CS received from the control circuit 830. Also, the frequency divider 860 may generate the phase interpolation clock signal PI_CLK_out and the phase interpolation clock inversion signal PI_CLK_outB on which frequencies are divided based on a division control signal Div_CS received from the control signal 830. Detailed operations of the phase selector 810, the phase mixer 820, and the control circuit 830 are described above, and thus they are not repeated here. According to at least some example embodiments of the inventive concepts, the phase selector 810, the phase mixer 820, and the control circuit 830 may have the same structure and/or operation as, for example, one or more of the phase selectors, phase mixers, and control circuits discussed above with respect to FIGS. 1-13.

Figure 15:
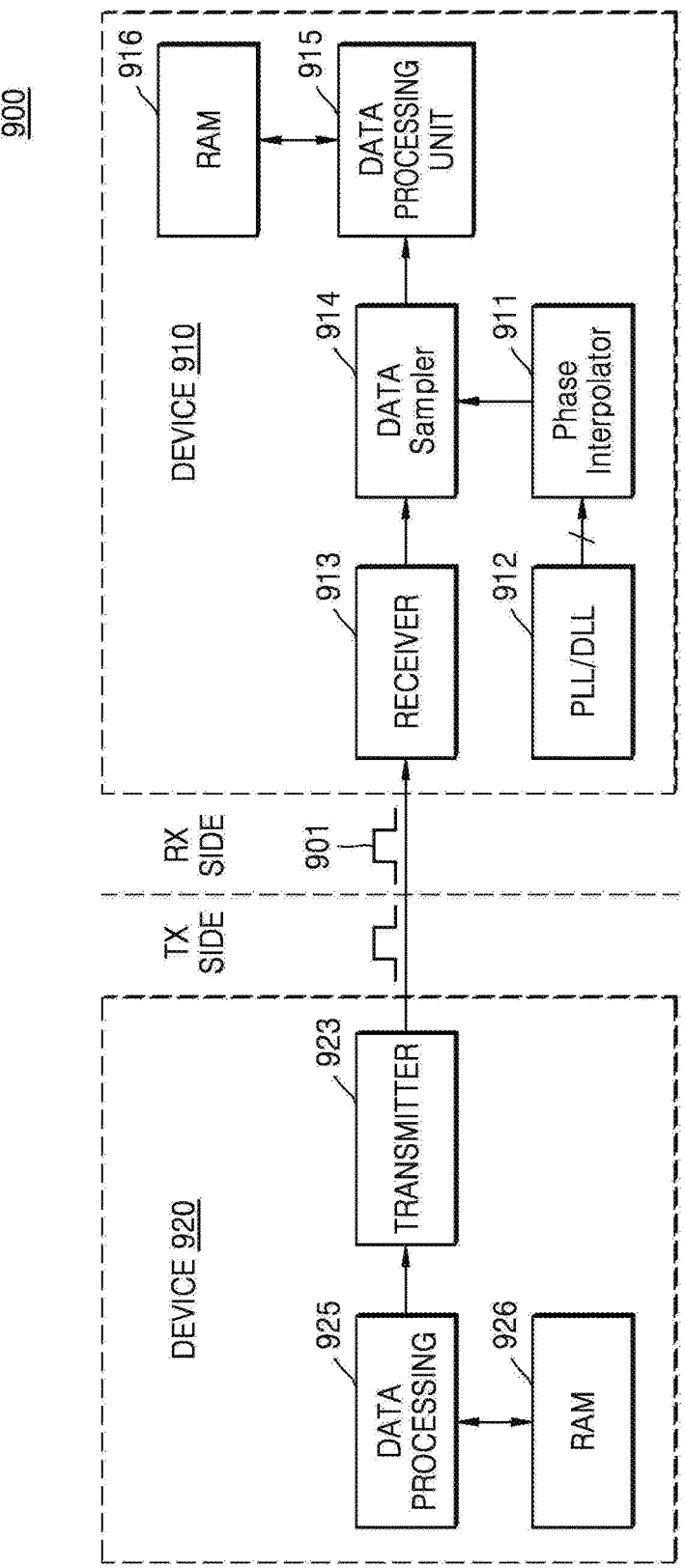
FIG. 15 is a block diagram of a system including apparatuses for performing a communication operation according to at least one example embodiment of the inventive concepts.

FIG. 15 is a block diagram of a system 900 including apparatuses 910 and 920 for performing a communication operation according to at least one example embodiment of the inventive concepts.

The system 900 may include the first apparatus 910 and the second apparatus 920. The first apparatus 910 and the second apparatus 920 may communicate with each other. The first apparatus 910 and the second apparatus 920 may be processing apparatuses including a computer, a network element (for example, a router and switches), a portable communication apparatus, etc. The first apparatus 910 may include a phase interpolator 911, a phase locked loop (PLL)/delay locked loop (DLL) circuit 912, a receiver 913, a data sampler 914, a data processor 915, and an RAM 916. The second apparatus 920 may include a transmitter 923, a data processor 925, and an RAM 926. The data processors 915 and 925 may be micro processors or central processing units (CPUs). The RAM 916 and 926 may include dynamic RAM (DRAM), synchronous DRAM (SDRAM), double data rate SDRAM (DDR SDRAM), static RAM (SRAM), etc.

The transmitter 923 of the second apparatus 920 may provide a data stream to the receiver 913 of the first apparatus 910 through a communication channel 901. The receiver 913 may provide the received data stream to the data sampler 914. The phase interpolator 911 may, as described with reference to FIG. 1, receive reference signals, i.e., a plurality of delay clock signals, from the PLL/DLL circuit 912, generate phase interpolation clock signals with various phases by using the reference signals, and provide the phase interpolation clock signals to the data sampler 914. The data sampler 914 may perform data sampling operation on the data stream a plurality of times by using the phase interpolation clock signals to generate sample data. The data sampler 914 may provide the sample data to the data processor 915. The data processor 915 may process a data sample by using the RAM 916. Also, the data processor 915 may measure a size of data EYE based on a result of processing the data stream and output status information of the communication channel 901. As described above, the data processor 915 may perform an EOM operation. According to at least some example embodiments of the inventive concepts, the phase interpolator 911 may have the same structure and/or operation as, for example, one or more of the phase interpolators discussed above with respect to FIGS. 1-14.

Figure 16:
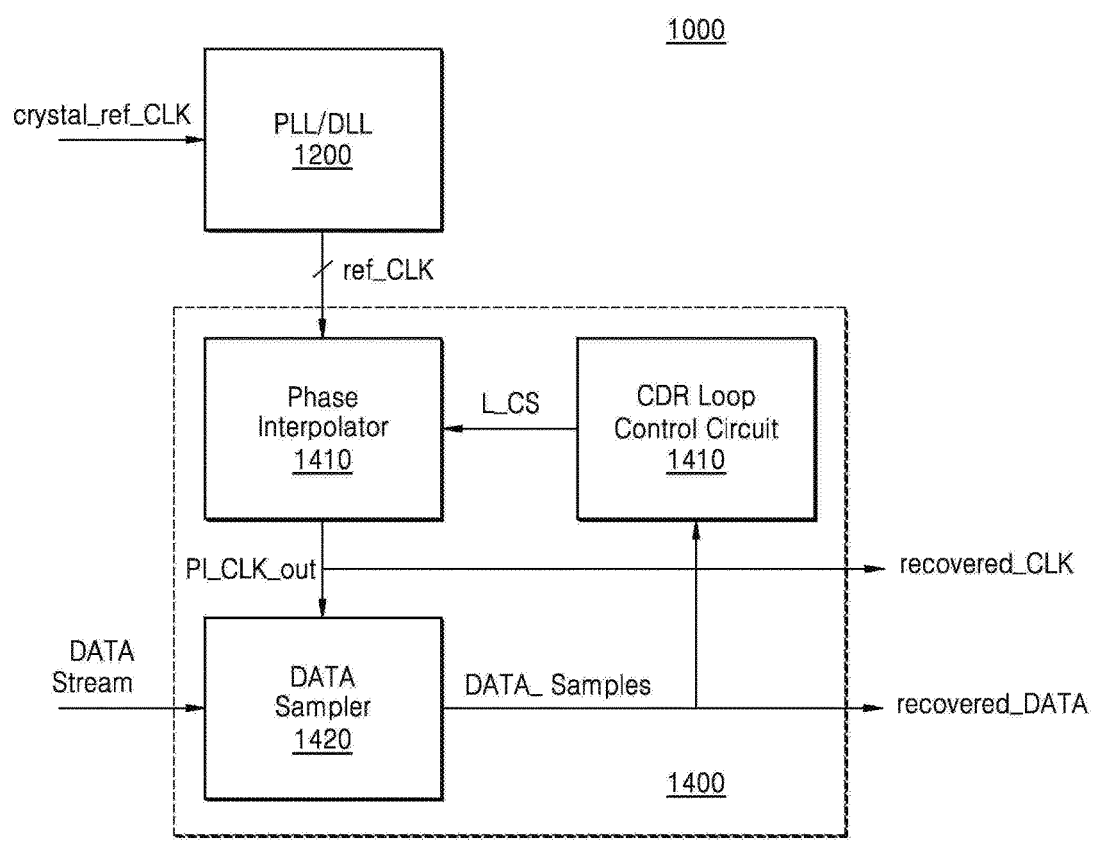
FIG. 16 is a block diagram of a clock and data recovery (CDR) apparatus according to at least one example embodiment of the inventive concepts.

FIG. 16 is a block diagram of a clock and data recovery (CDR) apparatus 1000 according to at least one example embodiment of the inventive concepts. Referring to FIG. 16, the CDR apparatus 1000 may include a PLL/DLL circuit 1200 and a CDR loop circuit 1400. The CDR loop circuit 1400 may include a phase interpolator 1410, a data sampler 1420, and a CDR loop control circuit 1430. According to at least some example embodiments of the inventive concepts, the phase interpolator 1410 may have the same structure and/or operation as, for example, one or more of the phase interpolators discussed above with respect to FIGS. 1-15. The PLL/DLL circuit 1200 may receive a crystal reference clock signal crystal_ref_CLK from outside and generate a reference clock signal ref_CLK by using the crystal reference clock signal crystal_ref_CLK. As described above, the phase interpolator 1410 may receive the reference clock signal ref_CLK and generate the phase interpolation clock signal PI_CLK_out based on a loop control signal L_CS received from the CDR loop control circuit 1430. Specifically, a control circuit of the phase interpolator 1410 may generate a selection control signal and a weight setting signal based on the loop control signal L_CS. A signal generator of the phase interpolator 1410 may generate the phase interpolation clock signal PI_CLK_out based on the selection control signal and the weight setting signal. The data sampler 1420 may receive a data stream DATA Stream from outside, perform a sampling operation by using the phase interpolation clock signal PI_CLK_out, and generate sample data DATA_samples. The data sampler 1420 may provide the sample data DATA_samples to the CDR loop control circuit 1430. The CDR loop control circuit 1430 may generate the loop control signal L_CS based on a result of performing clock and data recovery operations. Specifically, the CDR loop control circuit 1430 may determine whether the phase interpolation clock signal PI_CLK_out generated by the phase interpolator 1410 is located in the center of the sample data DATA_samples by using 4 phases sample data DATA_samples. As a result of determination, the CDR loop control circuit 1430 may generate the loop control signal L_CS. Through a CDR loop operation described above, the phase interpolator 1410 may generate a recovery clock signal recovered_CLK and provide the recovery clock signal recovered_CLK to the data sampler 1420. The data sampler 1420 may generate recovery data recovered_DATA by using the recovery clock signal recovered_CLK. As described above, the CDR loop circuit 1400 may generate the recovery clock signal recovered_CLK and the recovery data recovered_DATA and provide the recovery clock signal recovered_CLK and the recovery data recovered_DATA to a processor of the CDR apparatus 1000.

Example embodiments of the inventive concepts have thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A phase interpolator comprising:
a control circuit configured to generate a selection control signal that corresponds to a selected coarse phase interval, and generate a weight setting signal for generating a phase interpolation clock signal with an interpolated phase within the coarse phase interval;
a phase selector configured to receive a plurality of inversion delay clock signal pairs, select at least two inversion delay clock signal pairs from the plurality of inversion delay clock signal pairs based on the selection control signal, select and output a selection delay clock signal pair corresponding to the coarse phase interval from the selected at least two inversion delay clock signal pairs; and
a phase mixer configured to receive the selection delay clock signal pair from the phase selector and generate the phase interpolation clock signal based on the weight setting signal.

2. The phase interpolator of claim 1, wherein the phase selector comprises:
a plurality of differential multiplexers configured to receive the plurality of inversion delay clock signal pairs and select first signal pairs from among the plurality of inversion delay clock signal pairs.

3. The phase interpolator of claim 2, wherein the phase selector comprises:
a plurality of multiplexers configured to receive the first signal pairs and select the selection delay clock signal pair.

4. The phase interpolator of claim 1, wherein the phase selector is configured to select and output an inversion signal pair, which includes signals that are inverted with respect to the selection delay clock signal pair.

5. The phase interpolator of claim 4, wherein the phase mixer is further configured to receive the inversion signal pair from the phase selector and generate an phase interpolation clock inversion signal based on the weight setting signal, the phase interpolation clock inversion signal being inverted with respect to the phase interpolation clock signal.

6. The phase interpolator of claim 1, wherein the control circuit is configured to,
change a value of one of the selection control signal and the weight setting signal for controlling a phase interpolation operation, and
provide the selection control signal and the weight setting signal to the phase selector or the phase mixer.

7. The phase interpolator of claim 6, wherein the control circuit is configured to,
select a different coarse phase interval,
change a value of the selection control signal,
provide the selection control signal having the changed value to the phase selector, and
provide, to the phase mixer, a second weight setting signal having a same value as that of a first weight setting signal generated immediately before changing the value of the selection control signal.

8. The phase interpolator of claim 1 wherein,
the phase mixer further comprises:
a plurality of drivers, each driver from among the plurality of drivers including a CMOS inverter.

9. The phase interpolator of claim 8, wherein the plurality of drivers are configured to be selectively enabled and disabled based on the weight setting signal.

* * * * *